United States Patent
Schubert et al.

(10) Patent No.: US 9,209,828 B2
(45) Date of Patent: Dec. 8, 2015

(54) CONFIGURABLE MIXED-SIGNAL SYSTEMS

(71) Applicant: MISSING LINK ELECTRONICS, INC., San Jose, CA (US)

(72) Inventors: Nils Endric Schubert, San Jose, CA (US); Johannes Brock, Ulm (DE); Christian Grumbein, Weissenhorn (DE)

(73) Assignee: Missing Link Electronics, Inc., San Jose, CA (US)

( * ) Notice: Subject to any disclaimer, the term of this patent is extended or adjusted under 35 U.S.C. 154(b) by 0 days.

(21) Appl. No.: 14/419,642

(22) PCT Filed: Aug. 16, 2013

(86) PCT No.: PCT/US2013/055466
§ 371 (c)(1),
(2) Date: Feb. 4, 2015

(87) PCT Pub. No.: WO2014/031496
PCT Pub. Date: Feb. 27, 2014

(65) Prior Publication Data
US 2015/0180503 A1    Jun. 25, 2015

Related U.S. Application Data

(60) Provisional application No. 61/691,493, filed on Aug. 21, 2012.

(51) Int. Cl.
H03M 3/00 (2006.01)
G06F 17/50 (2006.01)
H03M 7/30 (2006.01)

(52) U.S. Cl.
CPC ........... *H03M 3/458* (2013.01); *G06F 17/5022* (2013.01); *G06F 17/5054* (2013.01); *G06F 17/5063* (2013.01); *H03M 3/30* (2013.01); *H03M 3/392* (2013.01); *H03M 3/46* (2013.01); *H03M 7/3015* (2013.01)

(58) Field of Classification Search
CPC .......... H03M 3/30; H03M 3/46; H03M 3/458
USPC .................................................. 341/143, 110
See application file for complete search history.

(56) References Cited

U.S. PATENT DOCUMENTS

| | | | | |
|---|---|---|---|---|
| 5,331,321 A * | 7/1994 | Mannonen | ..................... | 341/110 |
| 5,818,370 A * | 10/1998 | Sooch et al. | .................. | 341/120 |
| 6,621,434 B2 * | 9/2003 | Barry et al. | .................... | 341/141 |
| 6,670,900 B1 * | 12/2003 | Zhang | ............................ | 341/118 |
| 7,321,327 B1 * | 1/2008 | San et al. | ....................... | 341/144 |

* cited by examiner

*Primary Examiner* — Brian Young
(74) *Attorney, Agent, or Firm* — Douglas L. Weller

(57) ABSTRACT

An electronic system includes a configurable processing device. The configurable processing device includes a processor that performs digital processing, a first input that receives digital signal, a first output that sends digital signal and a converter that converts between analog and digital signals. The converter includes a delta-sigma modulator.

20 Claims, 31 Drawing Sheets

CONFIGURABLE MIXED-SIGNAL SYSTEMS

FIELD OF THE INVENTION

The present invention relates to the design of electronic systems in general and, more particularly, to mixed-signal electronic systems implemented with digital programmable circuitry.

BACKGROUND OF THE INVENTION

Electronic systems are driving innovation in daily life for many. An aspect of this is sometimes called ubiquitous computing or ambient intelligence. Electronic systems can perceive the environment by processing data from individual sensors or from entire sensor networks. Such electronic systems working with the internet can form Cyber-Physical Systems (CPS) that can make daily life more safe, more secure, more energy efficient, or simply more convenient.

Electronic systems need to interface with the "real" world by reading heterogeneous information, data, or signals from sensors, for example to process that data in some way and to output the results to interact with the environment via actuators. An embedded system is an electronic processing system that is functionally integrated with a target system. The target system typically is a mechanical system (or has at least some mechanical components or aspects), such as, for example a washing machine, a printing machine, a vehicle, an airplane, a manufacturing robot, or a medical diagnostic system. One or more embedded systems become a component of target system, as further discussed in Wolf, W. H. (2001), "Computers as Components: Principles of Embedded Computing System Design", Morgan Kaufman, which is herein incorporated by reference. The design of embedded systems, including, for example, hardware, software, firmware, computer architecture, real-time functionally, and so on, is well researched and documented, for example in Marwedel, P. (2010), "Embedded and cyber-physical systems in a nutshell" DAC.COM Knowledge Center Article. Connection of embedded systems to the Internet is discussed, for example, in "Cyber-Physical Systems" Lee, E. A. (2008); "Cyber Physical Systems: Design Challenges"; International Symposium on Object/Component/Service-Oriented Real-Time—ISORC 2008 which is herein incorporated by reference.

To be applicable and economically feasible, embedded systems must provide sufficient flexibility, for example, to adjust to changes in the data processing or to alterations in inputs and/or outputs. Therefore, it is highly desirable if an embedded system is built as a configurable system where changes can be applied over its lifecycle. Configurable Processing Devices (CPDs) are established semiconductor parts for implementing configurable systems. CPDs have a strong foothold in certain industries where configurability is key. For example, in networking, telecommunications, and military industries, embedded systems are used to implement entire data processing systems or at least significant portions thereof.

Field programmable gate arrays (FPGAs) are one type of CPD and are, for example, available from Xilinx Corporation, Altera Corporation, Lattice Semiconductors and other sources.

TERMINOLOGY

The following discussions will be made clearer by a brief review of the relevant terminology as it is typically (but not exclusively) used. Accordingly, to assist readers in understanding the terminology used herein, the following definitions are provided.

"Software" is defined as, but not limited to, programming language content written using a programming language. Examples of programming languages include C, C++, Basic, assembly, and Java.

"HDL" is a Hardware Description Language. A hardware description language is defined as any programming language that can describe the hardware portion of an electronic system. Examples of HDLs include VHDL which is described in the IEEE Standard 1076-2008 available from the Institute of Electrical and Electronic Engineers in Piscataway, N.J., which is hereby included in its' entirety by reference; Verilog HDL which is described in the IEEE Standard 1364-2005 available from the Institute of Electrical and Electronic Engineers in Piscataway, N.J., which is hereby included in its' entirety by reference; the various extensions of Verilog HDL, for example, OVL or SystemVerilog as, for example, described in "SystemVerilog 3.0—Accellera's Extensions to Verilog", both published by the Accellera Organization, Inc. in Napa Calif.; the SuperLog language from Co-Design Automation in Los Altos, Calif.; the Sugar verification language, originally developed by IBM Haifa Research Lab, Haifa, Israel; the "e" Verification Language from Verisity, Inc. in Mountain View, Calif.; and SystemC which is described in the IEEE Standard 1666-2011 available from the Institute of Electrical and Electronic Engineers in Piscataway, N.J., which is hereby included in its' entirety by reference; General purpose programming languages such as JAVA, C++, C, and assembly languages may also be used as a HDL.

"Verilog-AMS" is a derivative of the Verilog HDL. It includes analog and mixed-signal extensions (AMS) in order to define the behavior of analog and mixed-signal systems. It extends the event-based simulator loops of Verilog/SystemVerilog/VHDL, by a continuous-time simulator, which solves the differential equations in analog-domain.

A "RAM" is a Random Access Memory—defined as an electronic component capable of storing data.

"ASIC" is an Application Specific Integrated Circuit. An ASIC device is an electronic component of a system. ASICs are custom devices created for a specific purpose within the electronic system.

ASIC devices are easier and faster to create with respect to a full custom semiconductor device. An ASIC may be described using HDL and implemented using synthesis and may be a digital, or a mixed-signal, or an analog integrated circuit optimized and built for a specific application.

A "Programmable Circuit" is an integrated circuit device which can be user-programmed, or configured, without a manufacturing step, typically by uploading a configuration bit file into the device after power-up.

An "FPGA" is a Field Programmable Gate Array. FPGAs are electronic components that have a configurable function. These devices are able to change their functionality via a configuration information stream transferred to the device and are available from a number of different suppliers in a wide range of sizes and speeds. An FPGA design may be described using HDL and implemented using synthesis.

A "PLD" is an Programmable Logic Device. PLDs are electronic components that have a configurable function. These devices are able to change their functionality via a configuration information stream transferred to the device and are available from a number of different suppliers in a wide range of sizes and speeds. A PLD design may be described using HDL and implemented using synthesis.

An "FPAA" is a Field-Programmable Analog-Array, a special analog Programmable Circuit device.

A "CPLD" is a Complex Programmable Logic Device, another special Programmable Circuit device.

A "CPD" is a Configurable Processing Device which is an electronic component that has a configurable function and which includes some portion of a programmable, digital circuit, or programmable logic gates and/or spatial computing fabric.

A "Central Processing Unit" or "CPU" is circuitry controlling the interpretation and execution of software programmed instructions, performs arithmetic and logical operations on data, and controls input/output functions. For the following descriptions the term CPU may be used to also denote other processing elements such as microprocessors, digital signal processors, microcontrollers, etc.

A "FSM" is a Finite State Machine which can be implemented in a digital circuit—defined as an electronic system control structure. The design and implementation of FSM is described in great detail in Synthesis and Optimization of Digital Circuits, by Giovanni DeMicheli, McGraw Hill, 1994.

A "NCO" is a "Numerically Controlled Oscillator" which is an electronic component to operate as a digital signal generator which creates a synchronous, clocked discrete-time, discrete-valued representation of a waveform.

A "DSP" is a Digital Signal Processor, a CPU highly optimized towards processing digital signal values.

An "ASSP" is an Application-Specific Standard Processor which is an integrated digital circuit device which includes one, or more, CPUs, plus application-specific circuitry.

A "Microcontroller" or "MCU" is a digital and/or mixed-signal integrated circuit device which includes one, or more, CPUs plus special-purpose peripherals and inputs/outputs.

A "SOC" is a "System-on-a-Chip" which is defined as a device large enough to contain an entire electronic system implementations. SOC devices can integrate a number of electronic devices into one device and are digital and/or mixed-signal integrated circuit device which includes one, or more, CPUs, special-purpose peripherals, inputs/outputs, application-specific circuitry, memory, etc.

A "PSOC" is a "Programmable System-on-a-Chip" which is a SOC which is implemented using Programmable Circuits and which are a special form of CPD.

An "EPP" is an "Extensible processing platform" which is a special form of a CPD where programmable logic is combined with an integrated CPU, typically as a Hard Block.

A "register" is an element in digital circuitry which can store one or more bits. Examples for registers are the various types of flip-flops and latches.

"Electronic Components" are defined as but not limited to, transistors, logic gates, integrated circuits, semi-custom integrated circuits, full custom integrated circuits, application specific integrated circuits (ASICs), gate arrays, programmable logic devices (PLDs), field programmable gate arrays (FPGAs), CPUs, Random Access Memory (RAM), mixed signal integrated circuits, systems on a chip (SOC), and systems on a printed circuit board.

An "Electronic System" is defined as a system that contains one or more digital and/or analog Electronic Components connected together to perform specific operations or functions. An Electronic System can be implemented entirely of hardware (Electronic Components) or consist of a mix of hardware and software (programming language content).

"Mixed-signal Systems" are defined as Electronic Systems which incorporate both digital and analog signals.

The "HDL Design" is referred to as the portion of the electronic system which is described in HDL and implemented in hardware.

An "HDL description" is the textual description of an HDL Design.

"HDL source code" is referring to the text files which contain the HDL description.

"Synthesis" is defined as the process of creating an electronic implementation from the functional description of a system. An example of a tool that performs this operation is Design Compiler from Synopsys, Inc. in Mountain View, Calif., which reads electronic system descriptions written in a synthesizable subset of VHDL and Verilog and produces a technology mapped design as an output.

A "Functional Specification" is defined as the documentation that describes the necessary features and operations of a system.

A "Functional Simulator" or "Simulator" is a tool that mimics the functional behavior of a model of an electronic system which is described using HDL.

A "Hard Block" is an electronic system which has a pre-defined functionality and which can be incorporated into another electronic system. Commonly, the form of the Hard Block is such that the functionality of the Hard Block can not be altered. An example of a hard block is an HDL Design which implements an industry standard bus controller.

"SPICE" is "Simulation Program with Integrated Circuit Emphasis" is used to simulate integrated circuits and board-level design to predict the circuit behavior.

"MATLAB" is a numerical computing environment developed by The MathWorks, Inc.

"Real-time" means a task, process or response occurs substantially immediately. The term is used to describe a number of different computer features. For example, real-time operating systems are systems that respond to input immediately. Real-time is also used for describing tasks in which the computer must react to a steady flow of new information without interruption. Real-time can also refer to events simulated by a computer at the same speed that they would occur in real life.

"Security" is information security as applied to computers, embedded systems and networks, and means the collective processes and mechanisms by which sensitive and valuable information and services are protected from publication, tampering or collapse by unauthorized activities or untrustworthy individuals and unplanned events respectively.

"Safety" is the state of being safe, of being protected against consequences of failure, damage, error, accidents, harm. Functional Safety is freedom from unacceptable risk of physical injury or of damage to the health of people either directly or indirectly (through damage to property or to the environment).

"SIL" is Safety Integrity Level and is defined as a relative level of risk-reduction provided by a safety function, or to specify a target level of risk reduction. In simple terms, SIL is a measurement of performance required for a safety instrumented function according to the European Functional Safety standards based on the IEC 61508 standard, as it is defined in David, S. and Kennath, S. (2004).

Functional Safety, A Straighforward Guide to Applying IEC 61508 and Related Standards. Elsevier Butterworth-Heinemann, which is hereby included in its' entirety by reference, or in Alessandro, B.

(2007). Reliability Engineering—Theory and Practice. Springer Verlag, which is hereby included in its' entirety by reference. ASIL is Automotive Safety Integrity Level, as it is defined in DIN/ISO 26262, which is hereby included in its' entirety by reference.

An "Embedded System" is a computer system designed for specific control functions within a larger system, typically with real-time computing constraints. It is embedded as part of a complete device often including hardware and mechanical parts, as it is defined in Marwedel, P. (2010). Embedded and cyber-physical systems in a nutshell. DAC.COM Knowledge Center Article, which is hereby included in its' entirety by reference.

A "PCB" is a Printed Circuit Board.

An "ECU" is an "Electronic Control Unit" and is a generic term for any embedded system that controls one or more of the electrical systems or subsystems in a motor vehicle.

"PLB" is the "Processor Local Bus" which is defined by IBM's CoreConnect on-chip architecture.

"AXI" is the Advanced eXtensible Interface which is part of the Advanced Microcontroller Bus Architecture (AMBA) defined by ARM Ltd.

"OS" is "Operating System" which is Software code for resource, task, and user management of a data processing system.

"GSM" stands for Global System for Mobile Communications and is a standard set developed by the European Telecommunications Standards Institute to describe technologies for second generation digital cellular networks.

"UMTS" stands for Universal Mobile Telecommunications System and is a third generation mobile cellular technology for networks based on the GSM standard.

"LTE" stands for Long-Term Evolution and is a fourth generation mobile cellular technology for networks based on the GSM standard.

"GPS" is Global Positioning System which is a space-based satellite navigation system that provides location and time information in all weather, anywhere on or near the Earth.

"CAN" is Controller Area Network which is a vehicle bus standard ISO 11898 designed to allow microcontrollers and devices to communicate with each other within a vehicle without a host computer.

"MOST" is Media Oriented Systems Transport which is a high-speed multimedia network technology optimized by the automotive industry.

"Flexray" is an automotive network communications protocol developed by the FlexRay Consortium, and which is currently being converted into an ISO standard.

"LIN" is Local Interconnect Network which is a vehicle bus standard or computer networking bus system used within current automotive network architectures.

"ISDN" is "Integrated Services Digital Network" which describes a set of telecommunications standards for simultaneous transmission of voice, video, data, and other network services. and which are defined by the CCITT.

"AFDX" is Avionics Full-Duplex Switched Ethernet which is a data network for safety-critical applications that utilizes dedicated bandwidth while providing deterministic Quality of Service. AFDX is based on IEEE 802.3 Ethernet technology and is described specifically by the ARINC 664 specification.

"SPI" is Serial Peripheral Interface Bus which is a synchronous serial data link standard, named by Motorola, that operates in full duplex mode.

"IIC" is Inter-Integrated Circuit which is a multi-master serial single-ended computer bus invented by Philips that typically is used to attach low-speed peripherals.

"GPIO" is General Purpose Input/Output is generic pins on an integrated circuit whose behavior (including whether it is an input or output pin) can be controlled through software.

"Ethernet" is a family of computer networking technologies for local area networks and is standardized in IEEE 802.3.

"EtherCat" is Ethernet for Control Automation Technology which is an open high performance Ethernet based fieldbus system.

"ProfiNET" is the open industrial Ethernet standard of PROFIBUS & PROFINET International for automation.

"Sercos" is Serial Real-Time Communication System Interface which is a globally standardized open digital interface for the communication between industrial controls, motion devices (drives) and input output devices (I/O) and is classified as standard IEC 61491 and EN 61491.

"TTCAN" is Time-Triggered communication on CAN which is defined by the ISO 11898-4 standard.

"CANOpen" is a communication protocol and device profile specification for embedded systems used in automation. The basic CANopen device and communication profiles are given in the CiA 301 specification released by CAN in Automation.

"UDP" is User Datagram Protocol which is one of the core members of the Internet Protocol Suite, the set of network protocols used for the Internet.

"TCP/IP" is Transmission Control Protocol/Internet Protocol is a descriptive framework for the Internet Protocol Suite of computer network protocols created in the 1970s by DARPA. TCP/IP has four abstraction layers and is defined in RFC 1122.

"IPSec" is Internet Protocol Security which is a protocol suite for securing Internet Protocol (IP) communications by authenticating and encrypting each IP packet of a communication session. IPsec also includes protocols for establishing mutual authentication between agents at the beginning of the session and negotiation of cryptographic keys to be used during the session.

"RS232" is Recommended Standard 232 which is the traditional name for a series of standards for serial binary single-ended data and control signals connecting between a DTE (Data Terminal Equipment) and a DCE (Data Circuit-terminating Equipment).

"RS485" also known as EIA-485, also known as TIA/EIA-485 is a standard defining the electrical characteristics of drivers and receivers for use in balanced digital multi-point systems. This standard is published by the ANSI Telecommunications Industry Association/Electronic Industries Alliance (TIA/EIA).

"USB" is Universal Serial Bus which is an industry standard developed in the mid-1990s that defines the cables, connectors and communications protocols used in a bus for connection, communication and power supply between computers and electronic devices.

"PATA" is Parallel ATA which is an interface standard for the connection of storage devices such as hard disks, solid-state drives, floppy drives, and optical disc drives in computers.

"SATA" is Serial Advanced Technology Attachment which is a computer bus interface for connecting host bus adapters to mass storage devices such as hard disk drives and optical drives.

"PCIe" also known as PCI Express (Peripheral Component Interconnect Express) is a computer expansion bus standard maintained and developed by the PCI Special Interest Group.

"WiFi" is a mechanism that allows electronic devices to exchange data wirelessly over a computer network using the IEEE 802.11 family of standards.

"Bluetooth" is a proprietary open wireless technology standard for exchanging data over short distances, creating personal area networks with high levels of security, a standard which is maintained by the Bluetooth Special Interest Group.

"IRIG" is the "Inter-Range Instrumentation Group" time codes standardized by the Range Commanders Council in IRIG Standard 200-04, for example.

"HART" is the "Highway Addressable Remote Transducer" Protocol which is a standard for connecting smart devices, for example, which is from the Hart Communication Foundation, Austin, Tex.

"SNR" is signal-to-noise ratio and describes the proportion of the wanted Signal to the background noise.

"SFDR" is the Spurious-Free Dynamic Range is the strength ratio of the fundamental signal to the strongest spurious signal in the output.

DETAILED DESCRIPTION

CPDs have exceptional flexibility for interfacing with digital information, data, or signals but lack configurable analog connectivity. Herein is described a new class of electronic systems, so-called configurable mixed-signal systems (CMSS) and how these can be generated based on existing CPDs. Embodiments are discussed below with the accompanying figures. Those skilled in the art will readily appreciate that the detailed description given herein with respect to these figures is for explanatory purposes as the invention extends beyond these limited embodiments.

Figure 1:
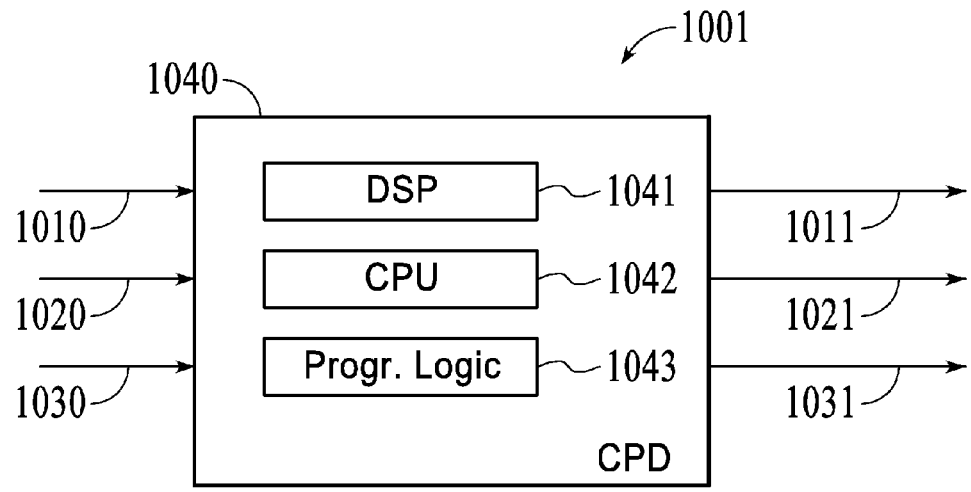
FIG. 1 shows a configurable mixed-signal system with analog and digital I/O.

One embodiment of a CMSS is set out in FIG. 1. A CMSS 1001 is implemented using a CPD 1040. CPD 1040 includes, for example, a DSP 1041, a CPU 1042 and programming logic 1043. CPD 1040, for example, has one or more high-speed serialized inputs represented by high-speed serialized inputs 1010. CPD 1040, for example, has one or more high-speed serialized outputs represented by high-speed serialized outputs 1011.

Alternatively, the CMSS 1001 can, for example, interface with one, or more, high-speed serialized outputs 1011, embedded inside CPD 1040. Alternatively, the CMSS 1001 can, for example, interface with one, or more, digital inputs 1020, embedded inside CPD 1040. Alternatively, the CMSS 1001 can, for example, interface with one, or more, digital outputs 1021, embedded inside CPD 1040. Alternatively, the CMSS 1001 can, for example, interface with one, or more, analog inputs 1030, embedded inside CPD 1040. Alternatively, the CMSS 1001 can, for example, interface with one, or more, analog outputs 1031, embedded inside CPD 1040.

Data processing can be done inside the CPD 1040, for example using programmable logic 1043, one, or more, digital signal processors (DSP) 1041 or one, or more, CPU 1042. It is obvious, that using multi-chip partitioning for example, CMSS can be implemented using more than one CPD. The high-speed serial inputs 1010 and/or the high-speed serial outputs 1011 and/or the digital inputs 1020 and/or the digital outputs 1021 can, for example be used to implement certain standard or de facto standard connectivity such as USB, Ethernet, DDR3 memory interfaces, SATA, SPI, I2C, etc.

In one embodiment there is implemented one, or more, analog inputs 1030 and/or the one, or more, correspondent analog outputs 1031 using a technique called delta-sigma modulator. Delta-sigma modulator, or sometimes also called sigma-delta modulators, or sigma-delta converters, or delta-sigma converters are an innovative approach for converting information, data, or signals between the analog domain and the digital domain. Delta-sigma modulators are, for example, described in Aziz, P., Sorensen, H., and van der Spiegel, J. (1996), "An overview of sigma-delta converters", Signal Processing Magazine, IEEE, 13(1):61-84, which is hereby included in its' entirety by reference.

Figure 2:
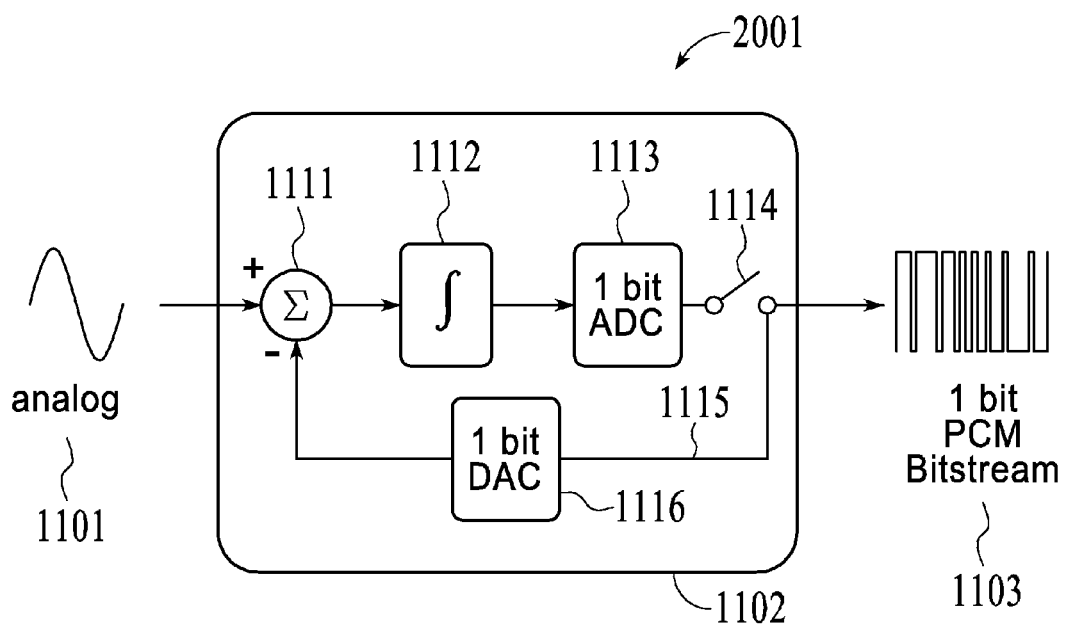
FIG. 2 shows a delta-sigma modulator for an analog-to-digital converter.

When used for converting information, data, or signals from the analog to the digital domain (as so-called analog-to-digital converters, ADC) the delta-sigma modulator can be the ADC component 1202 of FIG. 2. An analog signal 1101 which is an input to the analog-to-digital converter 1102 is converted into the digital signal 1103 which is an output to analog-to-digital converter 1102.

Figure 3:
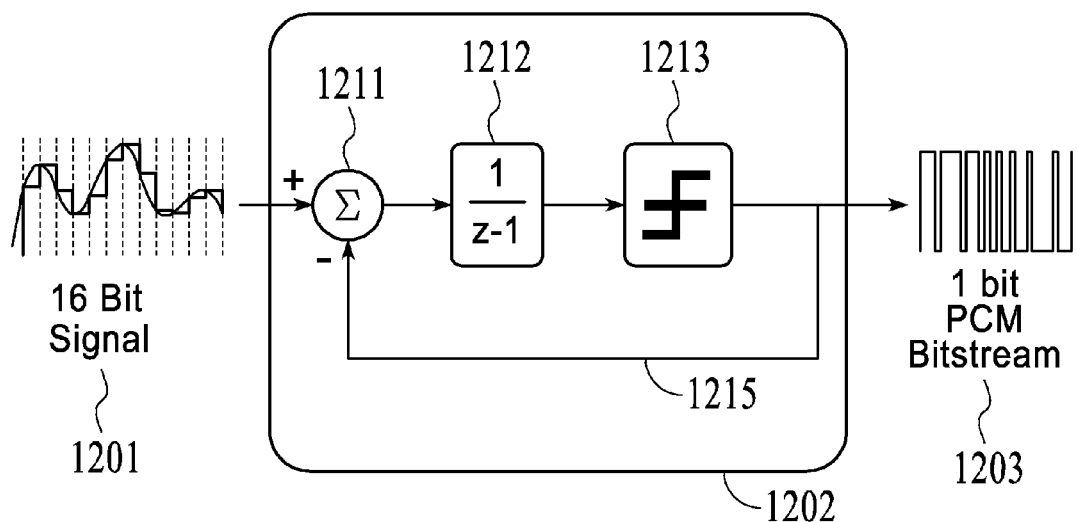
FIG. 3 shows a delta-sigma modulator for a digital-to-analog converter.

Typically, a delta-sigma modulator used as analog-to-digital converter includes a summation element 1111, a integrator element 1112, a one-bit ADC element 1113, a sampling element 1114, a feedback loop 1115, and a one-bit digital-to-analog converter element 1116. When used for converting information, data, or signals from the digital domain to the analog domain (as so-called digital-to-analog converters, DAC) the delta-sigma modulator can be the DAC component 1202 of FIG. 3. A digital signal 1201 which is an input to the digital-to-analog converter 1202 is converted into the analog signal 1203 which is an output to digital-to-analog converter 1202.

Typically a delta-sigma modulator used as digital-to-analog converter includes the summation element 1211, the delay element 1212, the quantizer element 1213, the feedback loop 1215.

Figure 4:
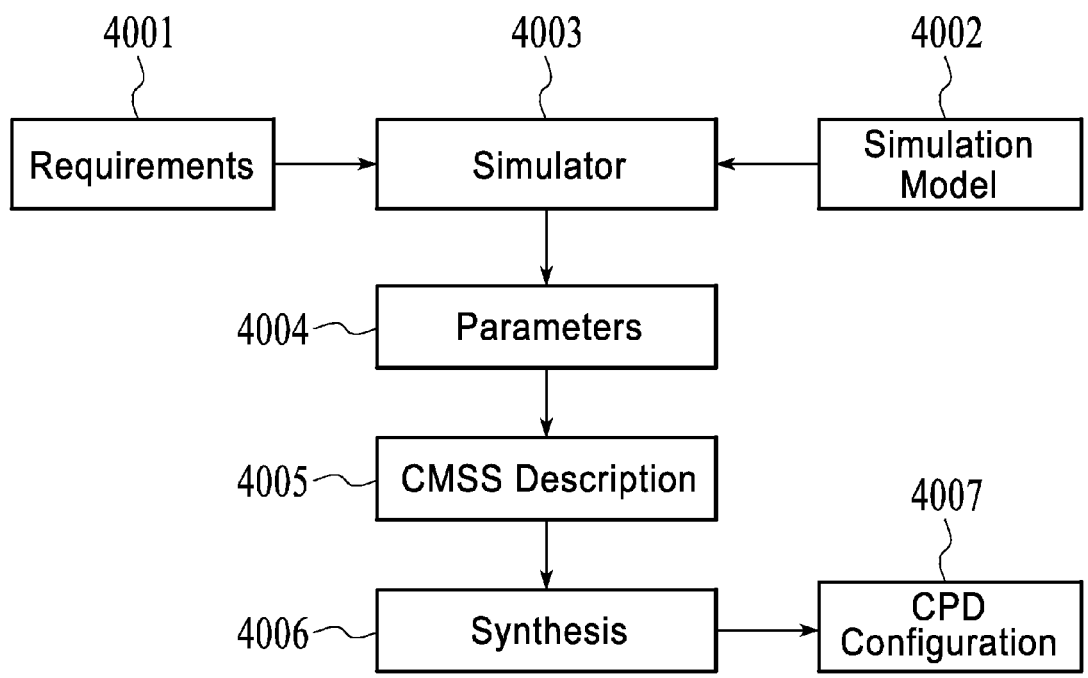
FIG. 4 shows a high-level method to generate delta-sigma modulators.

Another embodiment is a method for generating the necessary components for a CMSS to interface with and to process digital and analog information, data, or signals. FIG. 4 describes a method for generating a CMSS, for example the CMSS 1001 of FIG. 1. In step 4001 the requirements are gathered. These requirements can be supplied by a system designer or a design engineer. Requirements gathered can include the sample frequency, the sample resolution, internal data representations, their precision, signal-to-noise ratios, etc. In step 4002 this method accesses simulation models of the relevant CMSS components. Simulation models can, for example, be SPICE models of transistor level netlists for the CMSS, or Verilog-AMS models of the gate-level netlist of the CMSS, or MATLAB models of the functional description of the CMSS. In step 4003, using the simulation models of step 4002 and based on the requirements from step 4001 various combinations of parameter settings for different delta-sigma modulator implementations are analyzed and, once requirements are met, are kept as the parameter set 4004 of a possible solution.

The resulting parameters 4004 are then used to build a description 4005 of a CMSS. Such a description can, for example, be a RTL netlist in HDL, or any other synthesizable description suitable for generating a CMSS. In step 4006 this CMSS description 4005 is synthesized. Synthesis typically includes place and route for the target architecture of the CPD. The outcome of the synthesis 4006 is CPD configuration data, for example a CPD bitfile, suitable for configuration and/or programming the CPD in such a manner that the CPD implements the CMSS.

While many approaches for delta-sigma modulator components are known in the art, none of them are suitable for building CMSS. For example, the technique presented in U.S. Pat. No. 7,616,143 issued to Zhu for a Reconfigurable delta sigma analog-to-digital converter and customized digital filters with embedded FLASH FPGA and FLASH memory is hereby included in its' entirety by reference, makes use of dedicated analog-to-digital converter components outside an FPGA device which significantly diminishes the flexibility and, for example, does not allow adding additional analog inputs once the system is manufactured on a PCB. U.S. Pat. No. 8,212,100, which is hereby included in its' entirety by reference, teaches the use of delta-sigma modulator inside FPGA devices but fails to teach how to perform proper signal conditioning and how to obtain the implementation of delta-sigma modulator solely from using programmable logic gates and programmable inputs and/or outputs of a digital FPGA.

Figure 5:
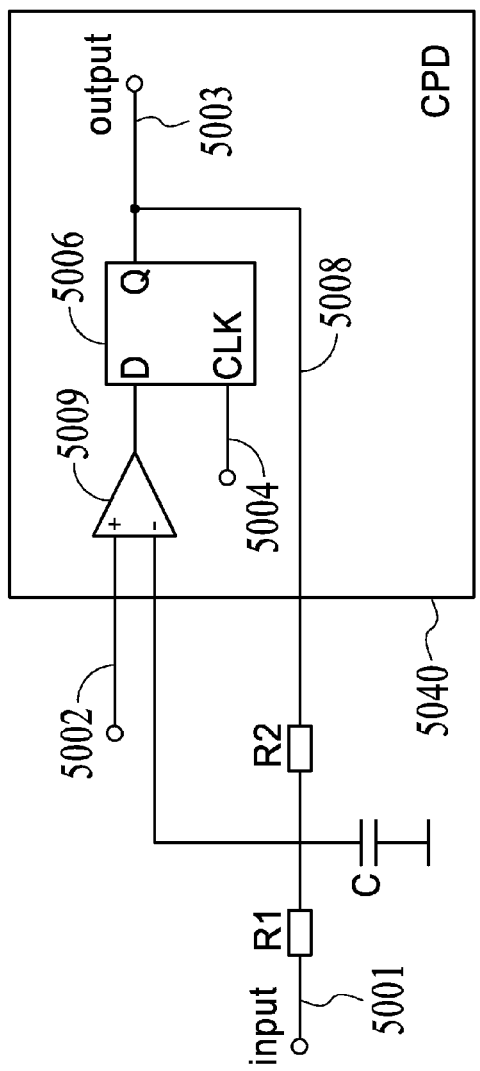
FIG. 5 shows gate-level circuitry for analog-to-digital converter (ADC) first-order delta-sigma modulator (DSM).

Delta-sigma modulator components are very suitable for implementing CMSS with FPGA or other CPD. In one embodiment, the DSM ADC component of FIG. 5 is used which corresponds with a first-order delta-sigma modulator. The DSM ADC component of FIG. 5 utilizes the LVDS input pin pair of CPD 5040 together with an LVTTL pin of CPD 5040 for the feedback loop through a network of passive components, namely resistor R1, resistor R2 and capacitor C. One input of the LVDS pin pair is driven by reference voltage 5002. A flip-flop implemented inside CPD 5040 is clocked by the sample frequency 5004. The information, data, or signals driving DSM ADC input 5001 is thereby converted into a serial bitstream of output 5003 to represent the digital sample values. Other than the passive components R1, R2 and C all other parts can be embedded inside the CPD 5040 thereby giving maximal flexibility for implementing analog inputs of a CMSS. Sometimes, it is advantageous to improve the signal-to-noise ratio of the DSM ADC. This can, for example, be done using the concept described in FIG. 6. There, an additional OpAmp 5107 improves the gain of the input signal 5101. Similar to FIG. 5, a network of passive components, namely resistor R1, resistor R2, and capacitor C, is used outside the CPD 5140.

Embedded inside CPD 5140 is a flip-flop clocked with sample frequency 5104 producing a serial bitstream of DSM ADC output 5103. FIG. 7 shows another embodiment featuring a second-order delta-sigma modulator. There, the analog input 5201 goes through a network of passive components resistor R1, resistor R2, resistor R3, resistor R4, capacitor C1, capacitor C2 outside the CPD 5240. Again, similar to FIG. 5 and FIG. 6, an LVDS pin pair is used embedded inside CPD 5240 clocked by sample frequency 5204 to compute a serial bitstream of DSM ADC output 5203 which represents the digital sample values of information, data, or signals at input 5201.

Figure 6:
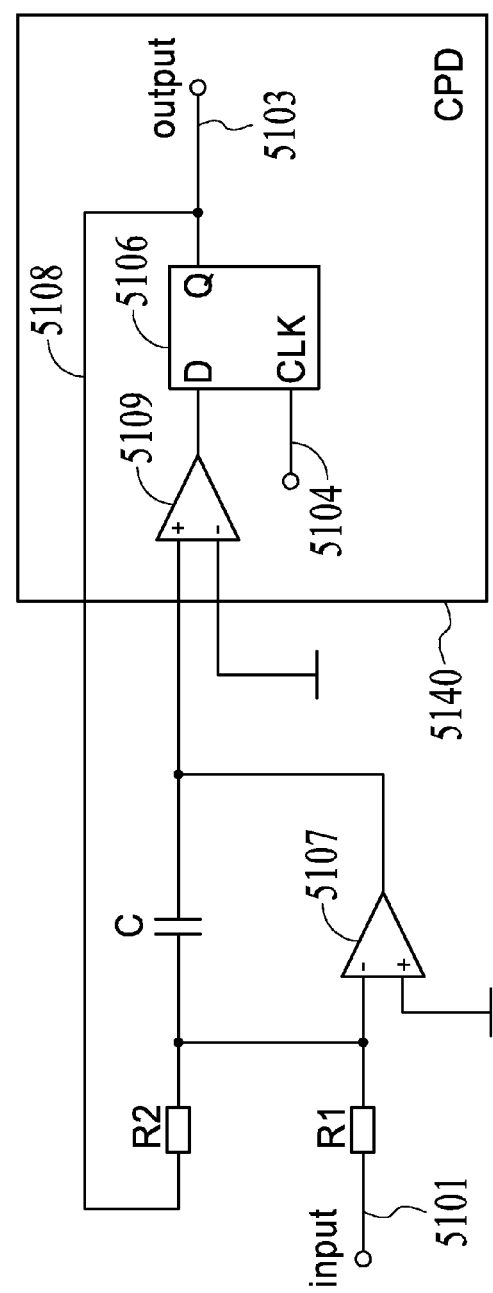
FIG. 6 shows gate-level circuitry for an ADC active first-order DSM.
Figure 7:
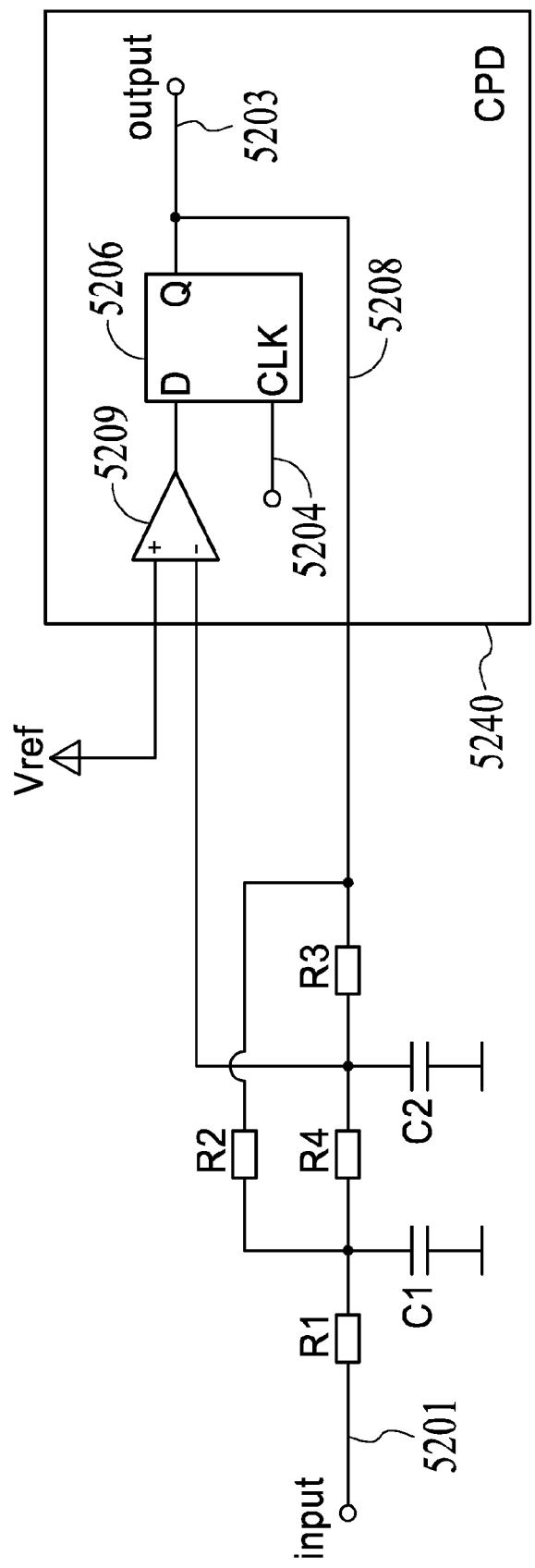
FIG. 7 shows gate-level circuitry for an ADC second-order DSM.
Figure 8:
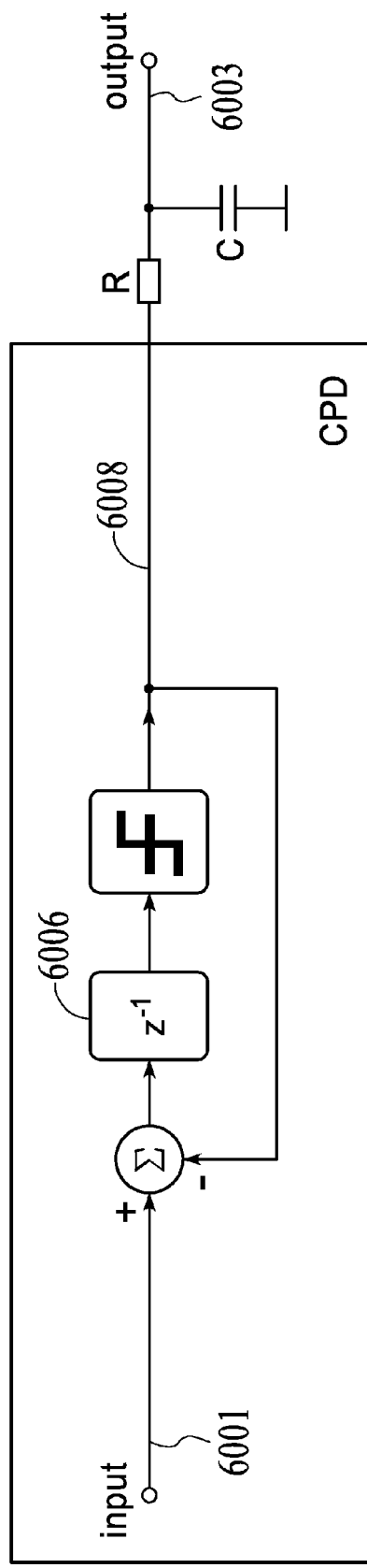
FIG. 8 shows gate-level circuitry for a digital-to-analog converter (DAC) first-order delta-sigma modulator.
Figure 9:
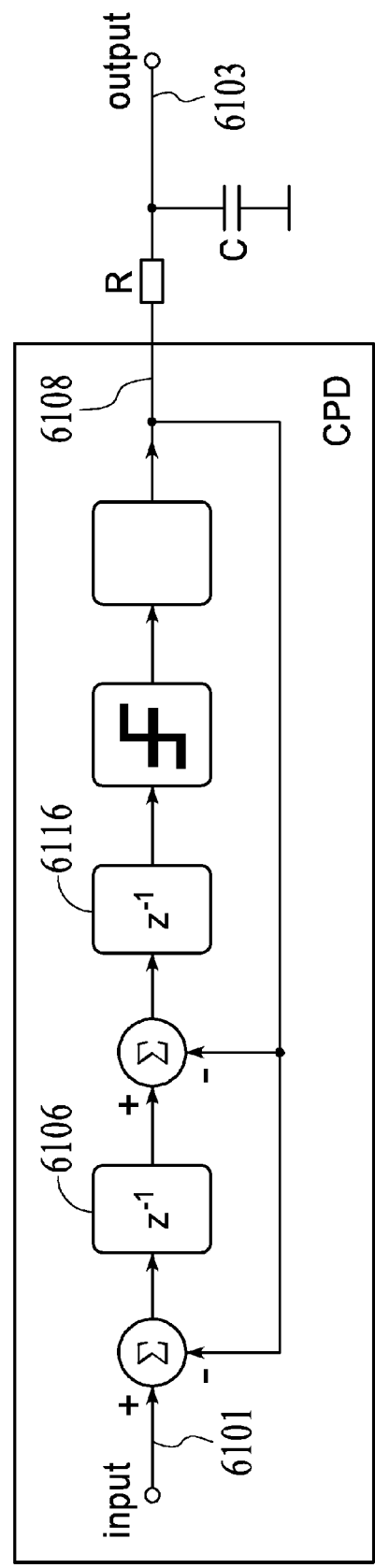
FIG. 9 shows gate-level circuitry for a DAC second-order DSM.

The above mentioned DSM ADC components from FIG. 5, FIG. 6, FIG. 7, as well as their obvious variants, enable a flexible and cost efficient implementation of analog inputs of a CMSS, so-called configurable mixed-signal system input (CMSSI). FIG. 8, FIG. 9, and their obvious variants, then enable flexible and cost efficient implementations for analog outputs of a CMSS, so-called configurable mixed-signal system output (CMSSO). FIG. 8 describes a DSM DAC in accordance to one embodiment. Inside the CPD 6040 digital information, data, or signals at DSM DAC input 6001 gets converted into a width-modulated signal driving LVTTL pin of CPD 6040. This signal then gets converted using the reconstruction filter of passive components resistor R, capacitor C outside CPD 6040 to become an analog signal driving DSM DAC output 6003. FIG. 9 shows a variant of the DSM DAC from FIG. 8 that uses a second-order delta-sigma modulator embedded inside CPD 6140. Similar to FIG. 8, the resulting width-modulated bitstream drives LVTTL pin of CPD 6140 which then get converted using the reconstruction filter of passive components resistor R, capacitor C outside of CPD 6140 to become an analog signal driving DSM DAC output 6103. While second-order delta-sigma modulator can result in much better signal-to-noise ratio, they are also less stable which can manifest itself in so-called limit-cycles, signal aliasing or other signal distortions or noise.

Figure 10:
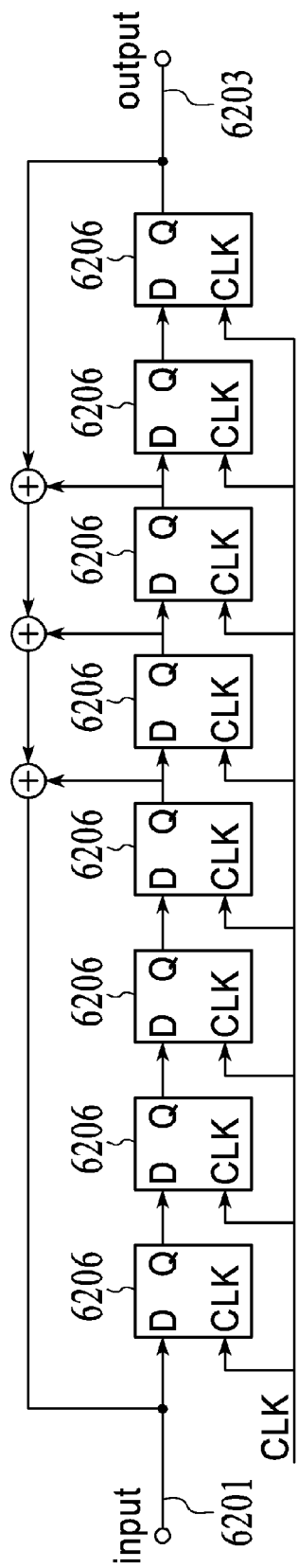
FIG. 10 shows an LSFR for a de-limit-cycle of the DSM DAC.

Therefore, there is deployed special techniques to stabilize the delta-sigma modulator components and to generate a CMSS with very good quality-of-results. One such enhancement is described in FIG. 10. There, a so-called linear feedback shift register (LSFR) can be used to add some artificial noise to the delta-sigma modulator. Typically inserted in the feedback loop to the DSM DAC, the LSFR takes the serial bitstream result of the DSM DAC as an input 6201, generates a slightly noisy signal at output 6203 to be fed into the DSM DAC. Simulation and experimental results show that this technique can significantly enhance the quality-of-results of the DSM DAC.

One of the key benefits of using delta-sigma modulator for analog connectivity in a CMSS is a Delta-Sigma Modulator's superior signal-to-noise ratio. This advantageous signal-to-noise ratio results from the oversampling and the noise-shaping effects of delta-sigma modulator. However, delta-sigma modulator are also known to be inherently unstable when operating outside a certain parameter space. Obtaining a proper configuration for the analog inputs and outputs of a CMSS is not trivial because one must find a stable and robust operating point for the underlying delta-sigma modulator.

This problem gets even more difficult when the delta-sigma modulator is to be implemented over a wide range of different CPDs, each with different electronic characteristics. Managing and controlling the analog behavior of what was designed, manufactured and tested to conform to digital electronic functioning specifications is the challenge.

Therefore, it is shown how to properly obtain stable and robust delta-sigma modulator configurations for CPD implementations that deliver good signal-to-noise ratio for the analog communication.

Figure 11:
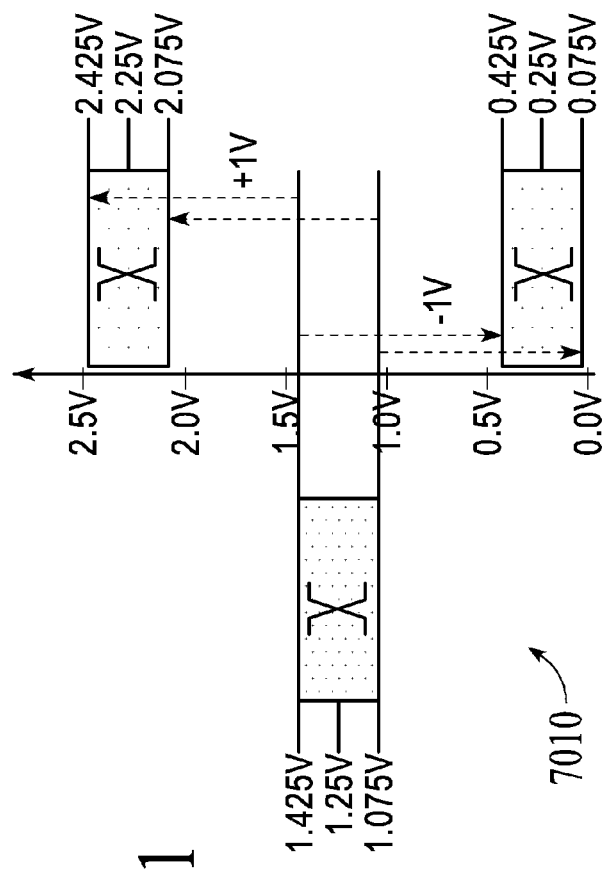
FIG. 11 shows low-voltage differential signaling.

One embodiment is a method for finding proper parameter settings for delta-sigma modulator. This method utilizes behavioral models of the circuitry components to build a delta-sigma modulator, for example DSM ADC of FIG. 5 or DSM DAC of FIG. 8. Fundamental to this novel method is an in-depth understanding of the LVDS Common-Mode behavior behind the LVDS pin pairs of the CMSS, including the behavior of LVDS comparator 5009 of FIG. 5 or 5109 of FIG. 6. This LVDS Common-Mode is, for example explained in Texas Instruments (2008). LVDS Owner's Manual. Texas Instruments, which is hereby included in its' entirety by reference, and which is also denoted by the area 7010 of FIG. 11. According to the above referenced LVDS standard this Common-Mode shall be between 250 mV to 350 mV of voltage swing.

During extensive analysis we have found that a typical CPD LVDS comparator delivers a much finer resolution of that voltage swing, sometimes lower than 30 mV. This has a significant impact on the stability and robustness of a delta-sigma modulator built from such a CPD LVDS comparator and, obviously, determines the signal-to-noise ratio and the overall quality-of-results of the CMSS analog processing.

Therefore, it is important to have a close look at the CPD elements used to implement a CMSS. These elements are the LVDS comparator 5009 of FIG. 5, or LVDS comparator 5109 of FIG. 6 or LVDS comparator 5209 of FIG. 7, the LVTTL output pin 5008 of FIG. 5, the LVTTL output pin 5108 of FIG. 6, the LVTTL output pin 5208 of FIG. 7, the LVTTL output pin 6008 of FIG. 8, the LVTTL output pin 6108 of FIG. 9, the CPD flip-flop element 5006 of FIG. 5, the CPD flip-flop element 5016 of FIG. 6, or the CPD flip-flop elements used to implement delay element 6006 of FIG. 8 or delay elements 6106 and 6116 of FIG. 9 or the delay elements 6206 of FIG. 10.

Figure 12:
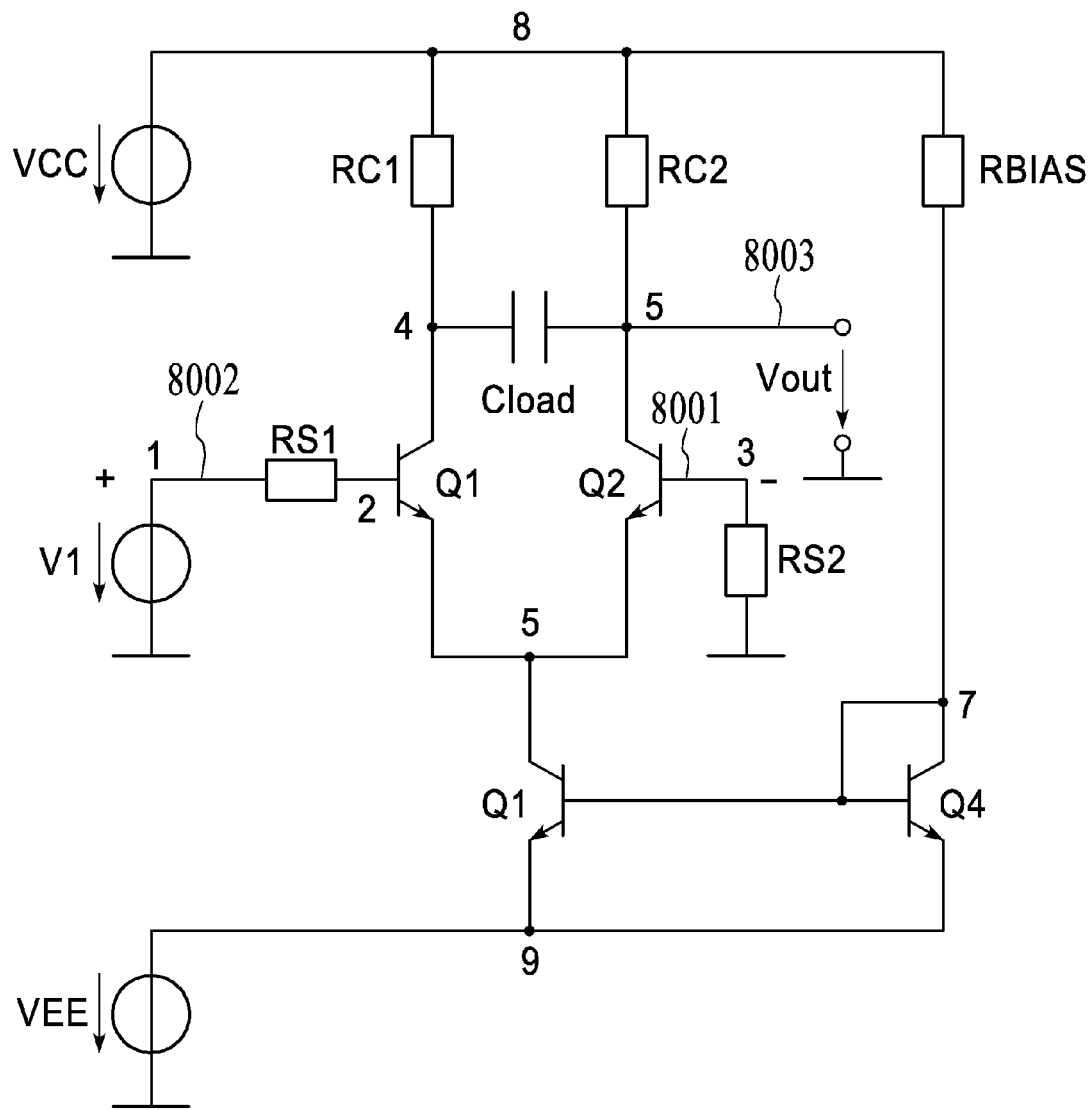
FIG. 12 shows transistor-level circuitry for an LVDS comparator.

FIG. 12 shows a transistor-level circuit description of a typical differential amplifier used for implementing an LVDS comparator. Inputs 8001 and 8002 are driven by the analog input signals and the result can be seen at output 8003. Other examples of LVDS comparator implementations used in the art for CPD elements can be found in U.S. Pat. No. 7,265,586 issued to Shi-dong Zhou for Programmable differential signaling system, which is hereby included in its' entirety by reference, or in U.S. Pat. No. 7,710,149 issued to Jonathan Chung et al. for Input buffer for multiple differential I/O standards, which is hereby included in its' entirety by reference.

Figure 13:
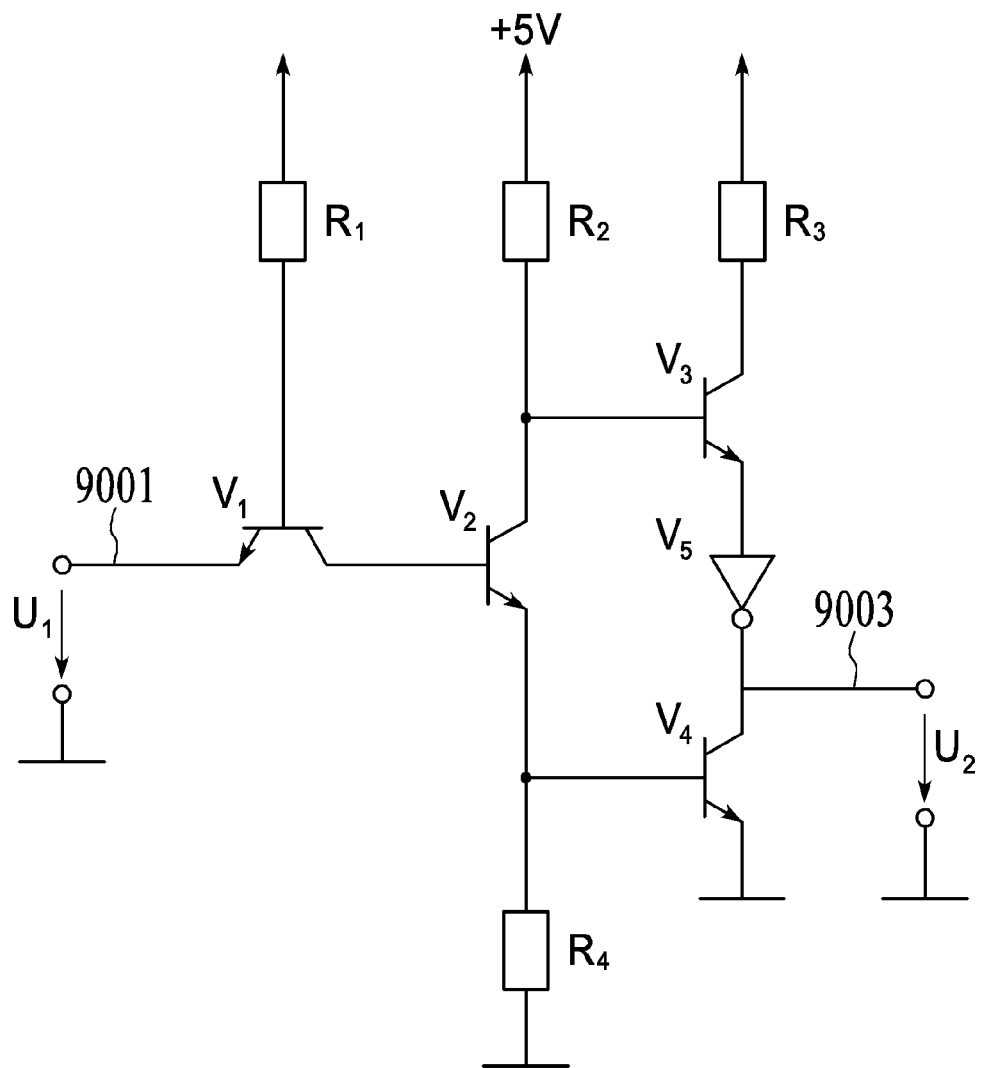
FIG. 13 shows transistor-level circuitry for a LVTTL pin.

FIG. 13 shows a transistor-level circuit description of a typical LVTTL driver which is used for implementing an LVTTL output pin. Other examples of LVTTL output pin implementations used in the art for CPD elements can be found in U.S. Pat. No. 6,271,679 issued to Cameron McClintock et al. for I/O cell configuration for multiple I/O standards which is hereby included in its' entirety by reference, or in U.S. Pat. No. 6,236,237, issued to Wong, M. W. and Chan, M. for Output buffer predriver with edge compensation, which is hereby included in its' entirety by reference.

Figure 14:
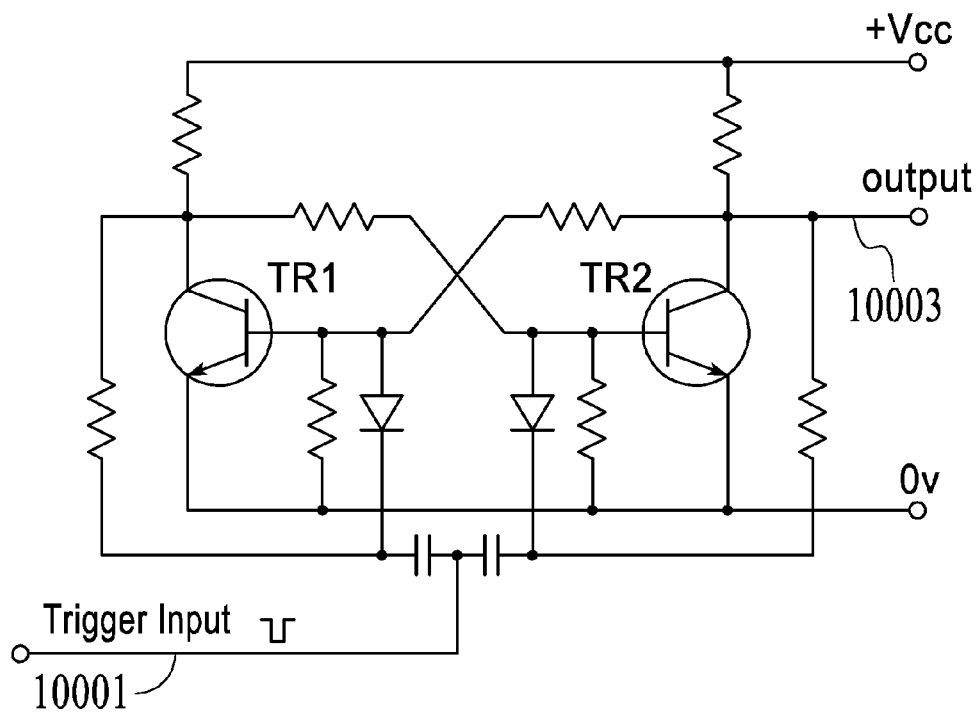
FIG. 14 shows transistor-level circuitry for a flip-flop.

FIG. 14 shows a transistor-level circuit description of a typical flip-flop which is used for implementing a CPD flip-flop. Other examples of flip-flop implementations used in the art for CPD elements can be found in U.S. Pat. No. 6,819,156 issued to Nix, M. A. for High-speed differential flip-flop, which is hereby included in its' entirety by reference, or in U.S. Pat. No. 5,670,896 issued to Sholeh Diba, W. Y. K. for High speed product term assignment for output enable, clock, inversion and set/reset in a programmable logic device, which is hereby included in its' entirety by reference, or in U.S. Pat. No. 4,677,318 issued to Veenstra, K. S. for Programmable logic storage element for programmable logic devices, which is hereby included in its' entirety by reference.

Figure 15:
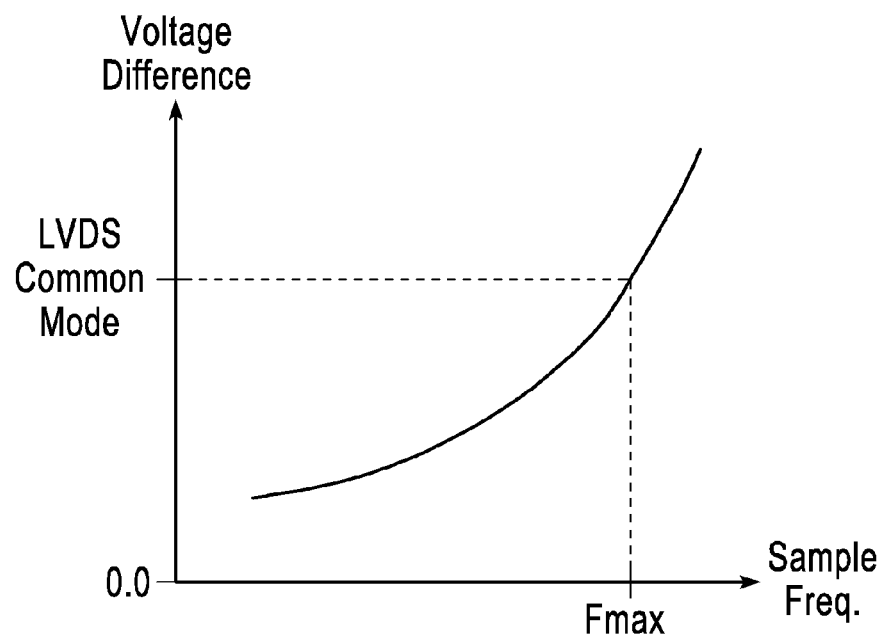
FIG. 15 shows frequency-voltage-chart for an LVDS comparator component of a delta-sigma modulator.
Figure 16:
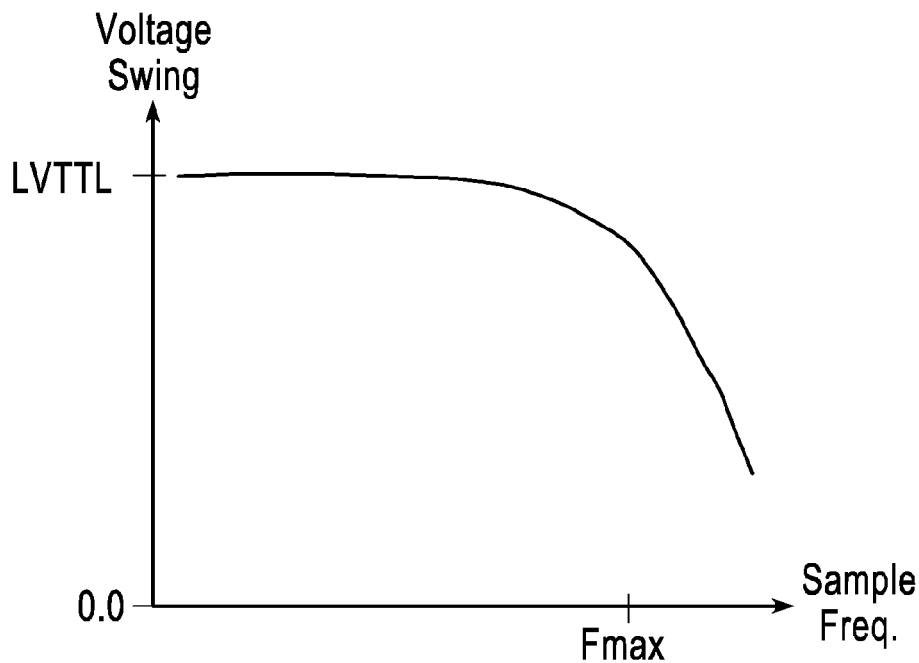
FIG. 16 shows frequency-voltage-chart for an LVTTL feedback component of a delta-sigma modulator.
Figure 17:
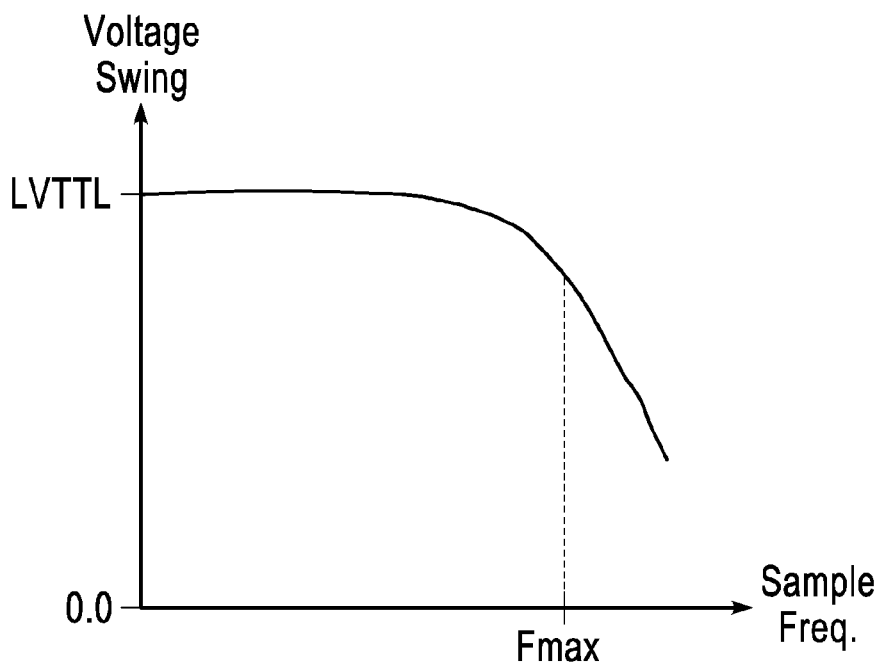
FIG. 17 shows frequency-voltage-chart for an adder component of a delta-sigma modulator.

These CPD elements typically show non-linear behavior which must be taken into account when implementing stable and robust delta-sigma modulator for CMSS. FIG. 15 shows this non-linear behavior, in an exemplary fashion, for a typical LVDS comparator in a typical CPD, for example the LVDS of FIG. 12. The voltage swing which corresponds to the LVDS Common-Mode, for example LVDS Common-Mode 7010 of FIG. 11, changes significantly depending on the sample frequency, for example sample clock 5004 of FIG. 5. FIG. 16 shows the non-linear behavior of LVTTL output pin, for example LVTTL output pin 9003 of FIG. 13. FIG. 17 shows the voltage swing over the sample frequency of the passive filter, for example the passive filter made by passive components R1, R2, C of FIG. 5 or by passive components R, C of FIG. 8. With this understanding of the electrical behavior of the CPD elements it is now possible to compute proper parameter settings which lead to stable and robust DSM ADC and DSM DAC components for a CMSS.

Figure 18:
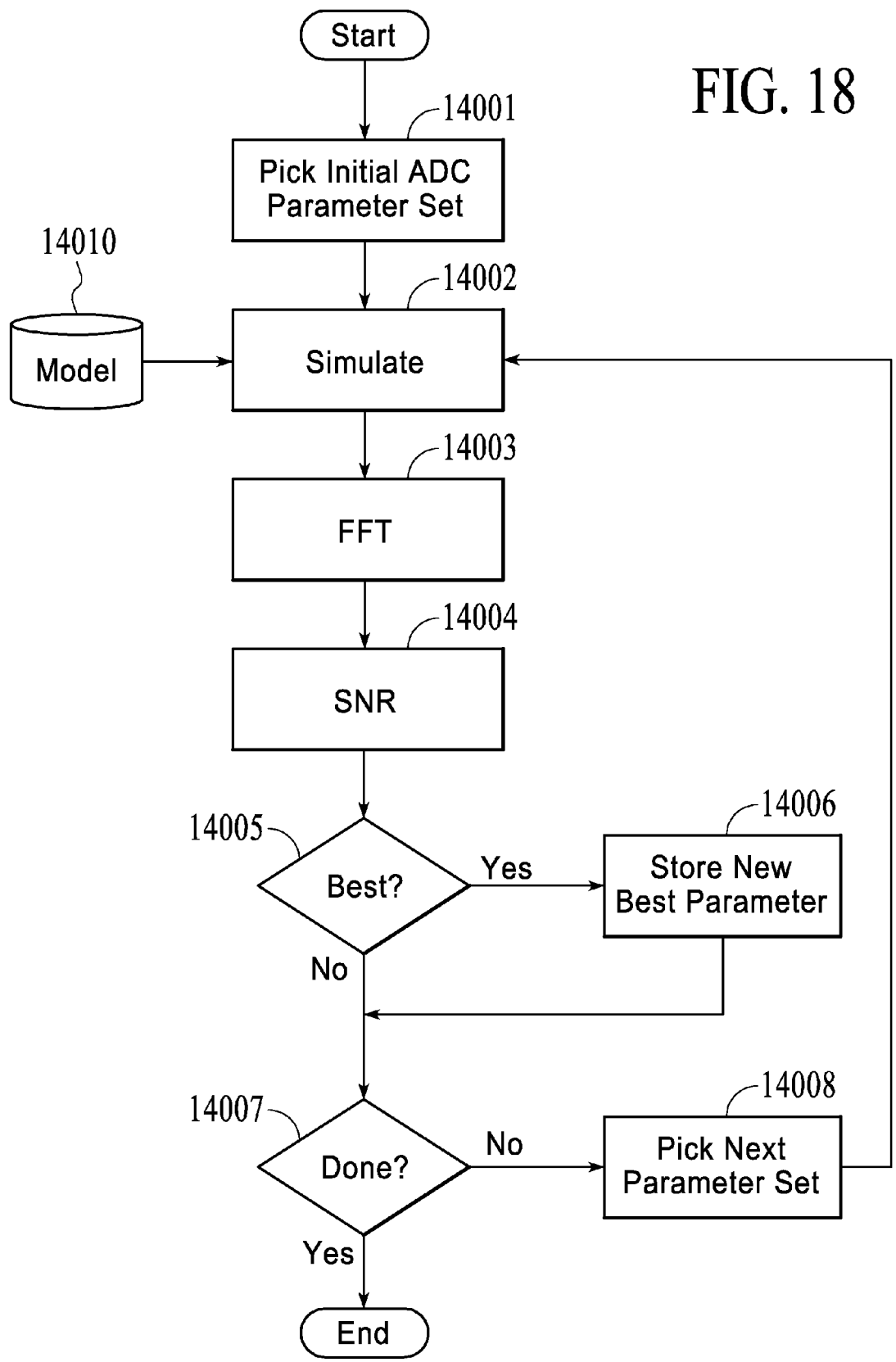
FIG. 18 shows a detailed flow diagram for simulation-based ADC delta-sigma modulator parameterization.

One embodiment is the method of FIG. 18 for computing proper parameter settings for a DSM ADC. In a first step 14001 an initial set of parameters is produced. This parameter set can include values for the resistors and capacitors, for example resistors R1 and R2 of FIG. 5, capacitor C of FIG. 5 and sample frequency 5004 of FIG. 5, for example. Together with a model description 14010 of the CPD elements which can include a model of the LVDS comparators behavior as described in FIG. 15 and/or a model of the LVTTL pin behavior as described in FIG. 16, and/or a model of the passive filter behavior as described in FIG. 17, the initial parameter set is then used for simulating the DSM ADC. Simulation is done in step 14002. Such simulation can, for example, be a MATLAB/Simulink simulation, or it can be a SPICE simulation, or it can be any other simulation suitable for analyzing the behavior of the DSM ADC. This simulation 14002 then computes the bitstream of the DSM ADC, which corresponds to bitstream 1103 of FIG. 3, for example for a given analog input signal, corresponding to input signal 1101 in FIG. 2. The input signal can be any analog signal, although a sine-wave signal with a predetermined frequency is best suitable for latter Fourier-Transformation and spectral analysis. In step 14003 this bitstream is then passed through a Fourier-Transformation (FFT) to obtain a spectrum of the digital sample output of the DSM ADC.

In step 14004 the signal-to-noise ratio (SNR) and/or SFDR values or any other metric suitable for analyzing the sample output signal quality, are computed. In decision 14005 it is checked whether the current parameter settings result is the so-far best sampling quality. If this is the case, in step 14006 the current parameter settings are stored as the best parameter set. Then, in decision 14007 it is checked whether any additional parameter settings shall be analyzed. If so, then the next parameter settings is operated on in step 14008 and the algorithm goes back to the simulation step 14002 to analyze the quality of this next parameter settings. If no more parameter settings shall be analyzed, the algorithm is finished and the parameter settings providing the best quality-of-results which were stored in step 14006, can be retrieved.

Figure 29:
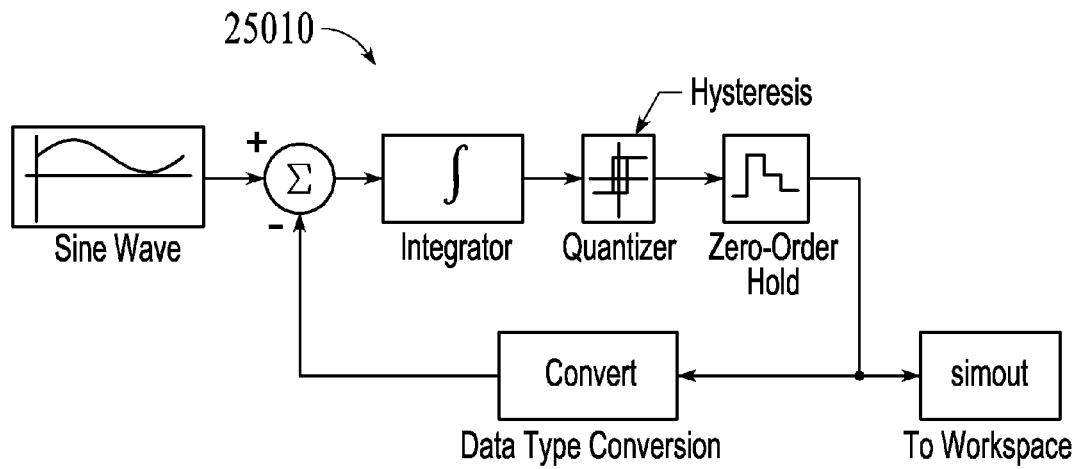
FIG. 29 shows an exemplary MATLAB model of mixed-signal FPGA input components.
Figure 30:
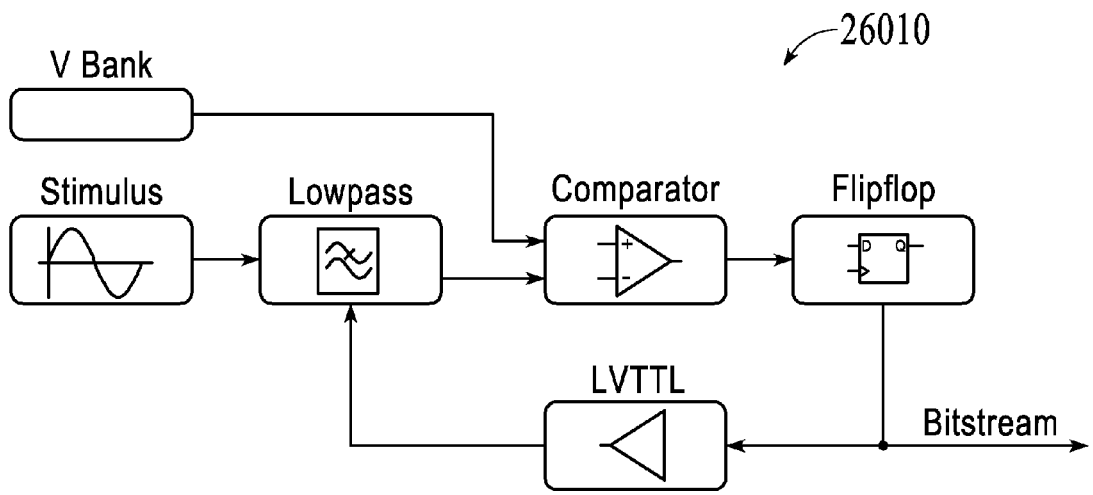
FIG. 30 shows an exemplary Verilog-AMS model of mixed-signal FPGA input components.

Because in a typical scenario many different parameter settings must be analyzed and thus many simulation runs (in step 1402) must be performed, it is crucial to select a simulation method, and obviously simulation models 14010, that provide a good trade-off between simulation accuracy and simulation runtime. FIG. 29 shows an exemplary model of a DSM ADC model suitable for simulation with MATLAB. Module 25010 shows the whole MATLAB model which is generated from the Simulink blocks for the sine source, the summation element, the Integrator, the comparator, the zero order hold module and the data type conversion module. In general, MATLAB models simulate in very short runtime but may lack the accuracy for certain applications of CMSS. FIG. 30 shows an exemplary model of a DSM ADC suitable for simulation in Verilog-AMS. Module 26010 shows the different elements, the delta-sigma modulator is built from which are the stimulus, the reference voltage, the low-pass filter, the comparator, the flip-flop and the LVTTL pin. In general Verilog-AMS models take more runtime during simulation but typically can be more accurate than MATLAB models.

Figure 31:
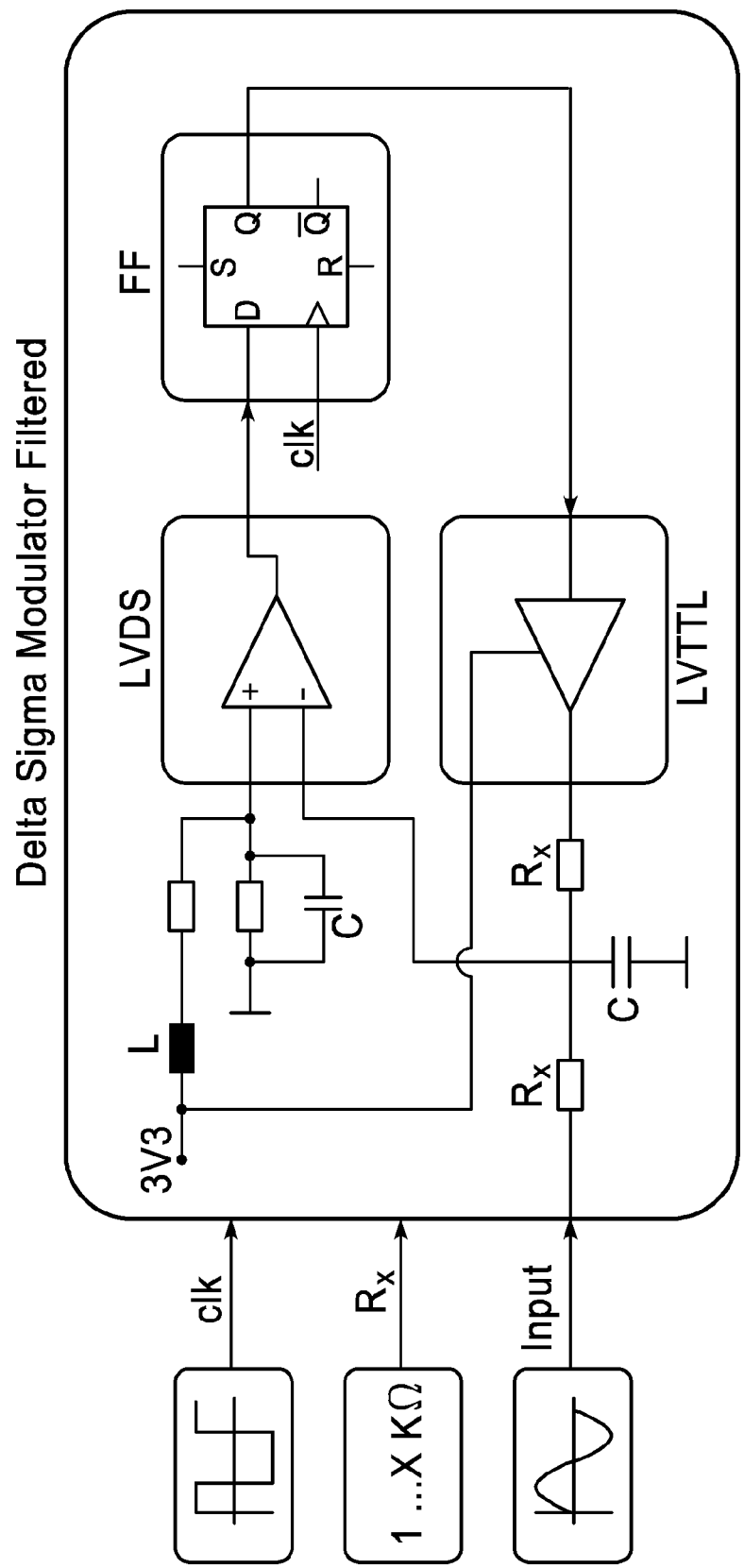
FIG. 31 shows an exemplary SPICE model of mixed-signal FPGA input components.

FIG. 31 shows a SPICE simulation model of a DSM ADC suitable for simulation with SPICE. In general, SPICE models are very accurate models but may take long run-times during simulation.

Figure 19:
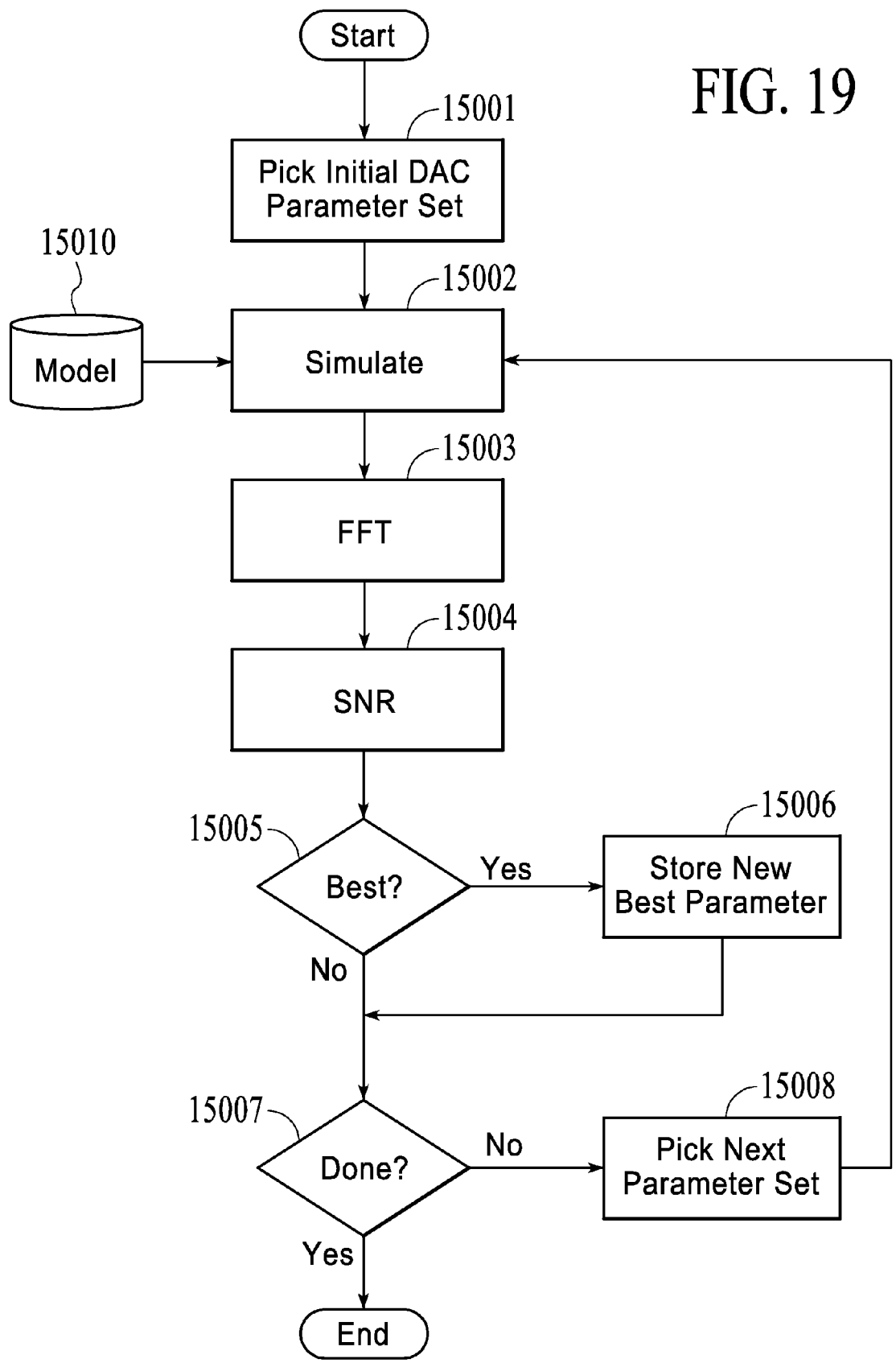
FIG. 19 shows a detailed flow diagram for simulation-based DAC delta-sigma modulator parameterization.
Figure 32:
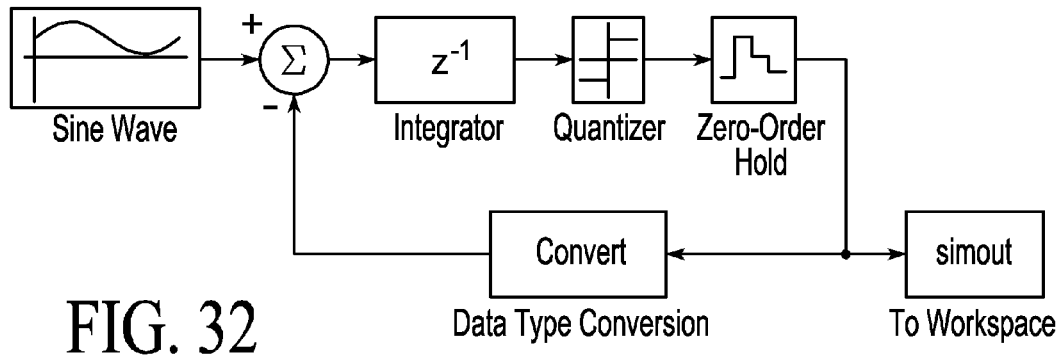
FIG. 32 shows an exemplary MATLAB model of mixed-signal FPGA output components.
Figure 33:
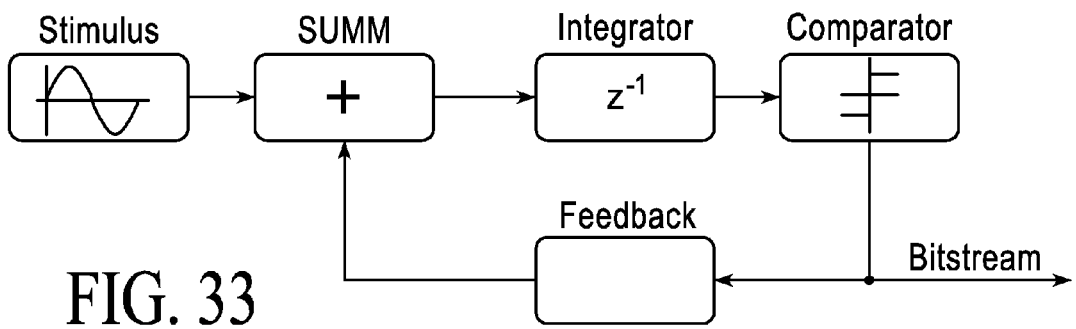
FIG. 33 shows an exemplary Verilog-AMS model of mixed-signal FPGA Output Components.

FIG. 32 shows an exemplary model of a DSM DAC suitable for simulation with MATLAB. FIG. 33 shows an exemplary model of a DSM DAC suitable for simulation with Verilog-AMS. Sometimes not only a model of the CPD is available but their precise individual semiconductor integrated circuit. In this case, the CPD element circuitry can be characterized, for example at transistor-level or at geometry-level and a very precise model for the CPD elements can be obtained which greatly enhances the outcome of the algorithm of FIG. 18 and FIG. 19, for example.

The overall quality of analog signal processing in a CMSS is greatly influenced by proper parameterization of the underlying delta-sigma modulator, but also by other system-level aspects. This adds to the complexity as obviously a holistic design approach must be taken. This includes digital signal processing methods suitable and optimized for post processing the sample values received from a delta-sigma modulator in a CPD, for example.

Figure 20:
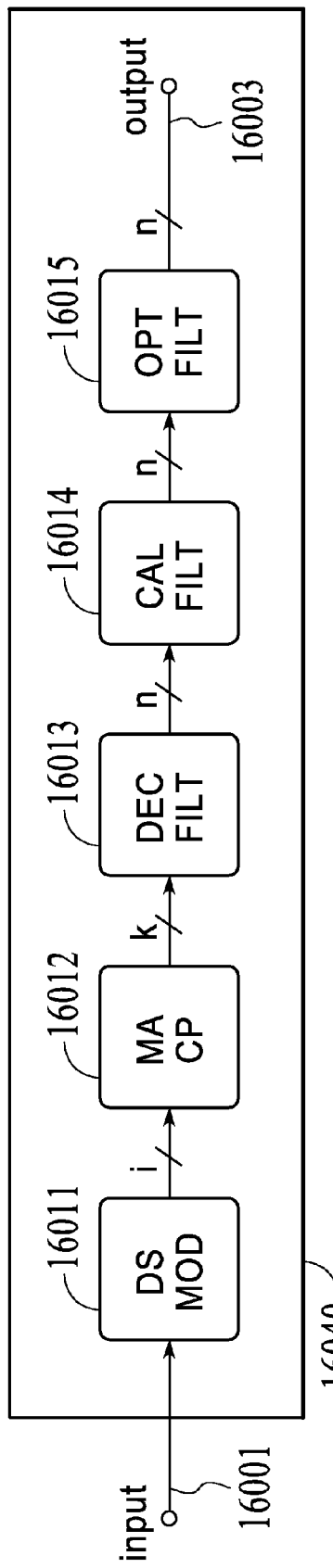
FIG. 20 shows structure of a mixed-signal FPGA input.
Figure 22:
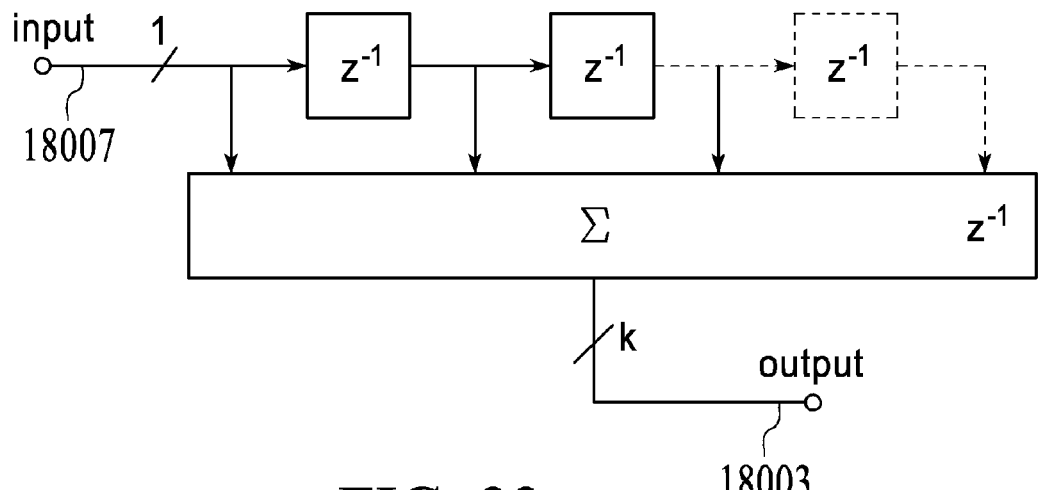
FIG. 22 shows an anti-aliasing moving-average filter component suitable for mixed-signal FPGA input.

FIG. 20 describes the structure of analog input signal processing inside a CMSS, in accordance to one embodiment. A CMSS input component (CMSSI) 16001 is implemented inside a CPD 16040. The analog signal at the input 16001 is first converted by DSM ADC 16011. This DSM ADC 16011 can, for example, be the DSM ADC of FIG. 5, or the DSM ADC of FIG. 6, or the DSM ADC of FIG. 6, or a DSM ADC computed by the method of FIG. 18. The bitstream output 16011 of DSM ADC can then be processed by the moving-average low-pass filter 16012. This moving-average low-pass filter can, for example be the moving-average low-pass filter of FIG. 22, where a bitstream is processed and results in the k-bit wide data representation 18003. A typical moving-average low-pass filter can have 1024 taps. Many techniques are known in the art for implementing moving-average low-pass filter for example using program instructions for a CPU, for example CPU 1042 of FIG. 1, or program instructions for a DSP, for example DSP 1041 of FIG. 1. From a resource perspective the moving-average low-pass filter can be very efficiently implemented using programmable logic gates, for example programmable logic gates 1043 of FIG. 1. The k-bit wide response from the moving-average low-pass filter 16012 can then be processed by the decimation filter 16013.

Figure 23:
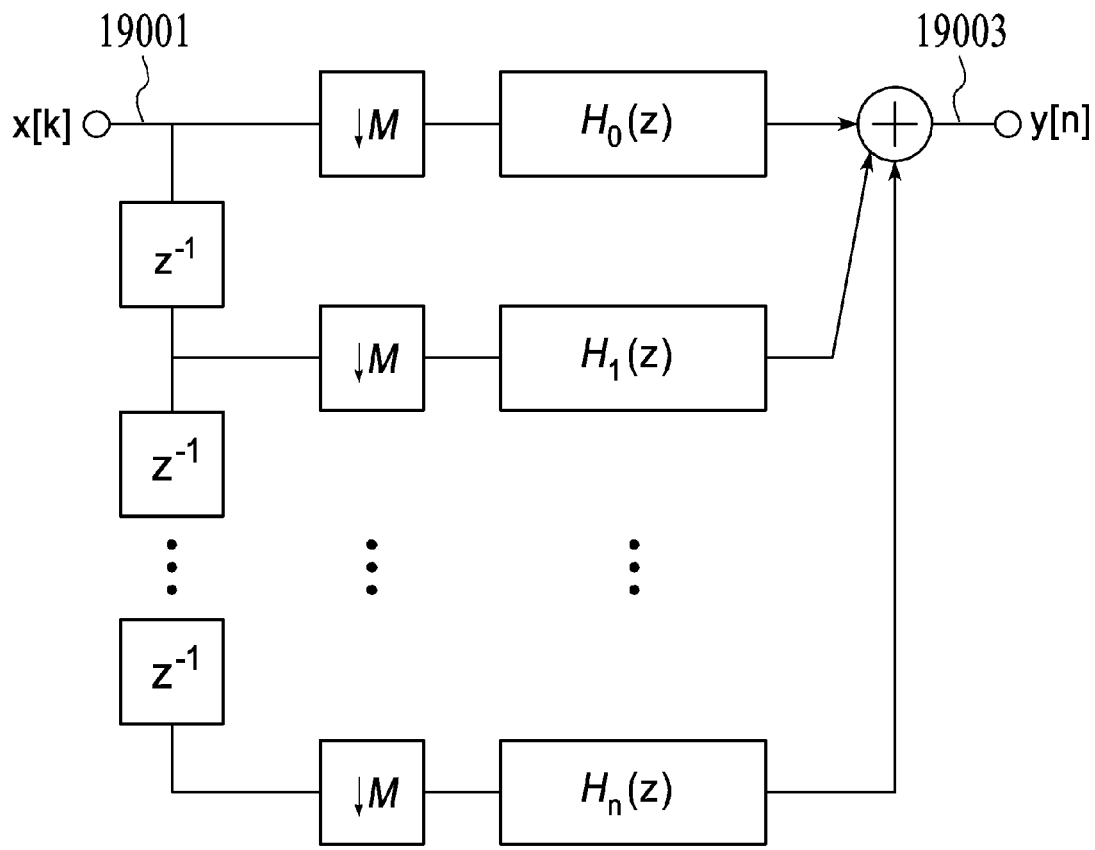
FIG. 23 shows a decimation filter component suitable for mixed-signal FPGA input.
Figure 24:
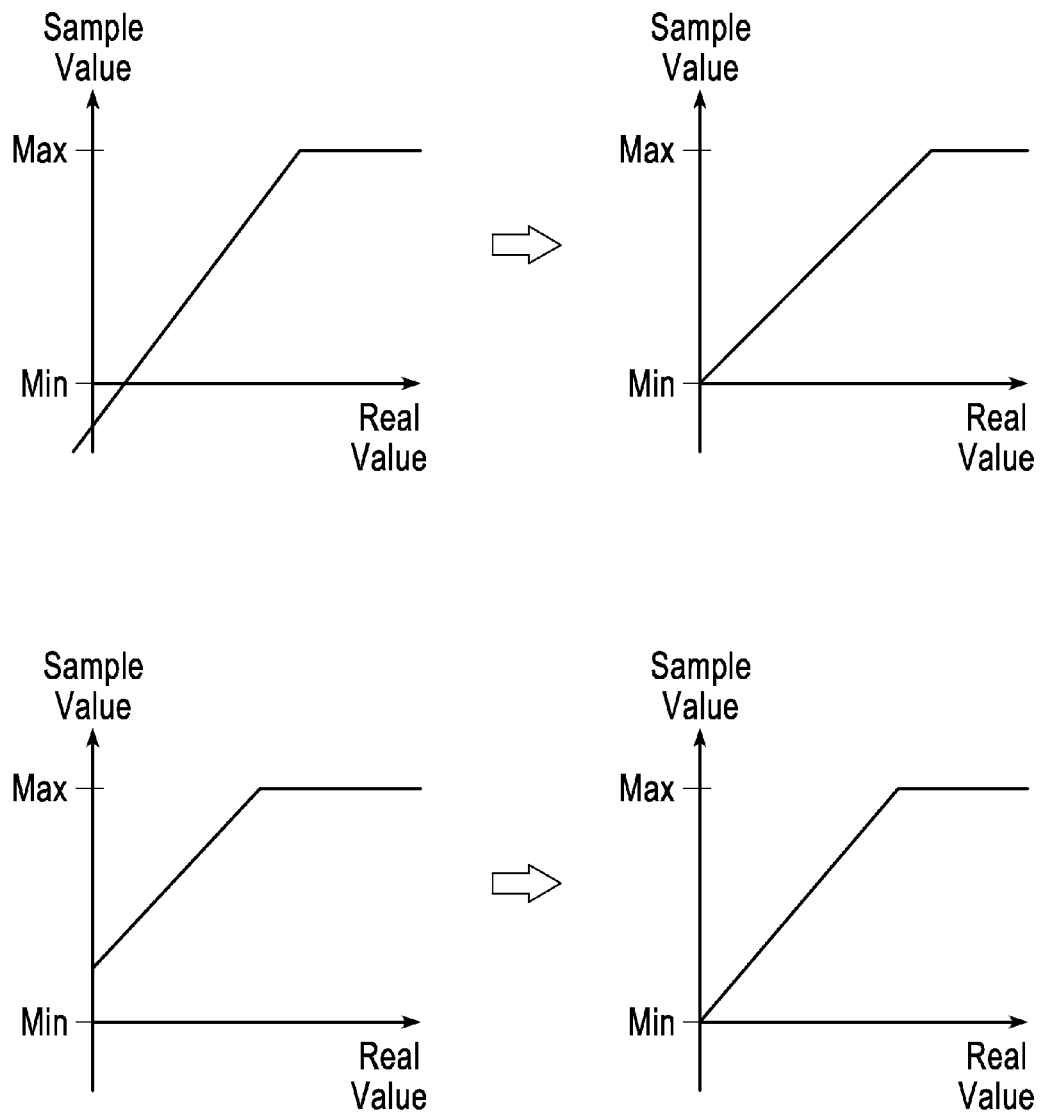
FIG. 24 shows a calibration module component suitable for mixed-signal FPGA input.
Figure 25:
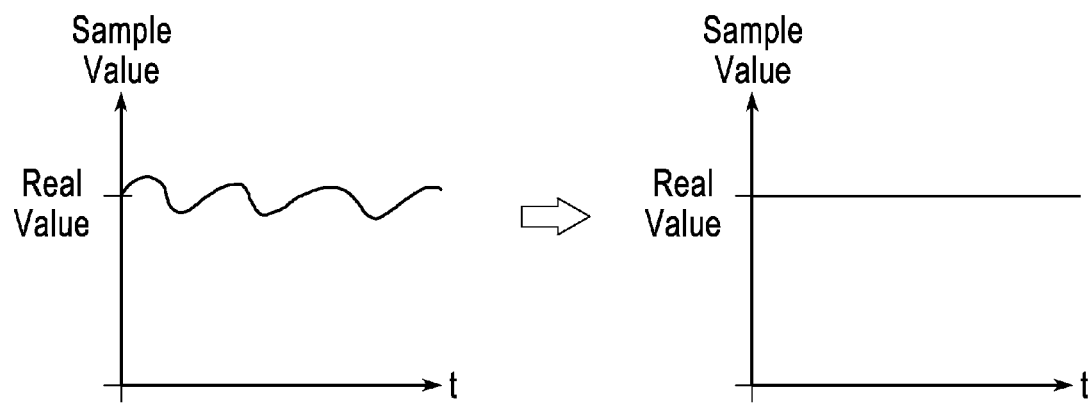
FIG. 25 shows a zero-offset filter component suitable for mixed-signal FPGA input.

This decimation filter 16013 can, for example, be the decimation filter of FIG. 23, where the k-bit wide data stream at decimation filter input 19001 gets processed and results in the n-bit wide data representation observable at decimation filter output 19003. Many techniques are known in the art for implementing decimation filter, for example using program instructions for a CPU, for example CPU 1042 of FIG. 1, or program instructions for a DSP, for example DSP 1041 of FIG. 1. From a resource perspective the decimation filter can be very efficiently implemented using programmable logic gates, for example programmable logic gates 1043 of FIG. 1. The n-bit wide response from the decimation filter 16013 can then be processed by a calibration filter of FIG. 24, where a zero offset in the n-bit sample values can be corrected, depending on a negative offset (see FIG. 24 top) or a positive offset (see FIG. 24 bottom). Many techniques are known in the art for implementing calibration filters, for example using program instructions for a CPU, for example CPU 1042 of FIG. 1, or program instructions for a DSP, for example DSP 1041 of FIG. 1. From a resource perspective the calibration filter can be very efficiently implemented using programmable logic gates, for example programmable logic gates 1043 of FIG. 1. The n-bit wide response from the decimation filter 16014 can then, optionally, be processed by the zero-offset filter 16015. This zero-offset filter 16015 can for example be the zero-offset filter of FIG. 25, where a n-bit wide data stream witch may have a "ripple" around a median value gets adjusted into a flattened n-bit wide value. Many techniques are known in the art for implementing calibration filter, for example using program instructions for a CPU, for example CPU 1042 of FIG. 1, or program instructions for a DSP, for example DSP 1041 of FIG. 1. From a resource perspective the calibration filter can be very efficiently implemented using programmable logic gates, for example programmable logic gates 1043 of FIG. 1. The n-bit wider response from the calibration filter 16014 or, optionally, the n-bit wide response from the zero-offset filter 16015 then represents the input 16001. The analog-to-digital converted and filtered sample values are now suitable for further digital signal processing inside the CMSS. It is obvious how to select a representation in n-bit wide data words where the bit-width n matches the processing system's data representation, say 16 bit, for example.

Figure 21:
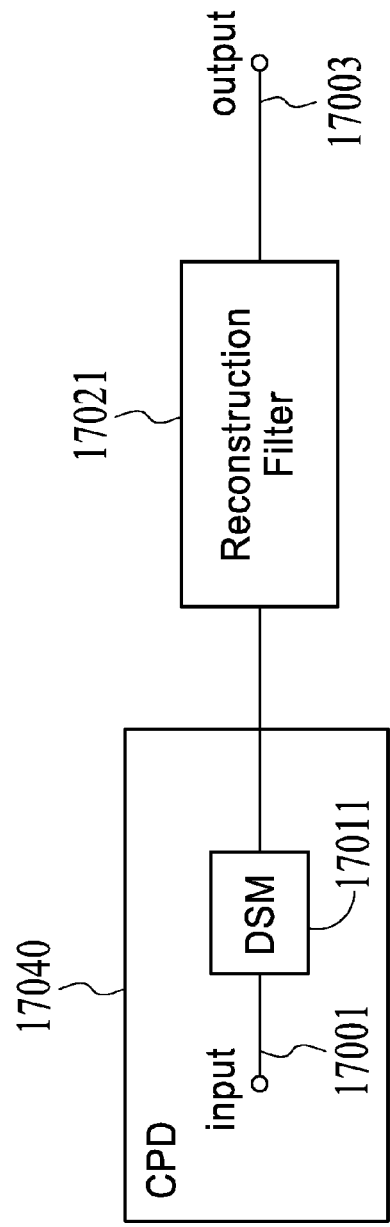
FIG. 21 shows structure of a mixed-signal FPGA output.
Figure 26:
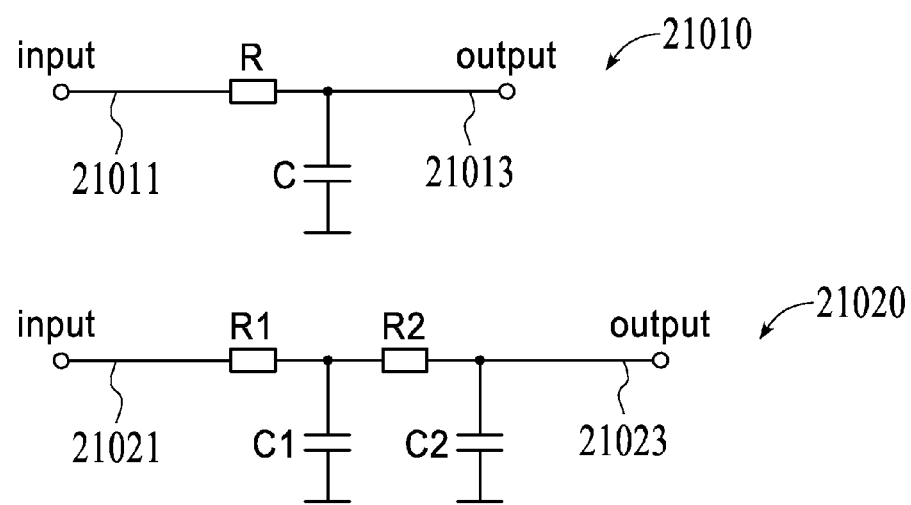
FIG. 26 shows a reconstruction filter component suitable for mixed-signal FPGA output.

FIG. 21 describes the structure of analog output signal processing for a CMSS, in accordance to one embodiment. A CMSS output component (CMSSO) signal 17003 is obtained by a DSM DAC 17011, which can, for example, be computed by the method described in FIG. 19. DSM DAC 17011 receives digital signal data on its input 17001 and performs digital-to-analog conversion embedded inside the CPD 17040. This is followed by a subsequent reconstruction filter 17021, which converts the information, data, or signals into a proper analog signal, observable at the CMSSO 17003. This reconstruction filter can, for example be the reconstruction filter 21010 of FIG. 26, or the reconstruction filter 21020 of FIG. 26, which each receives a serial bitstream at its reconstruction filter input 21011, or 21021 resp., and reconstructs the analog signal, now observable at reconstruction filter output 21013, or 21023 resp. While the reconstruction filter 21010, or reconstruction filter 21020 are built entirely from passive components it is obvious how a reconstruction filter can be built using active comparators such as OpAmps, for example.

Mixed-signal FPGA are a special class of CMSS where functionality is implemented inside an FPGA, or any other CPD, and via using the above mentioned techniques for analog-to-digital converter and digital-to-analog converter the digital FPGA can now connect to analog signals. Such Mixed-Signal FPGA extend the digital-only application domain from FPGA into mixed-signal Domain, but unlike FPGA with dedicated analog inputs or outputs, mixed-signal FPGA can turn almost any of the configurable digital inputs and/or outputs into inputs and/or outputs which can handle analog signals as well. The design of mixed-signal FPGA requires special techniques because the space for theoretically possible but not necessarily well working (nor feasible) solutions is quite large and may require repeated computations, for example the computations performed in FIG. 18, or FIG. 19.

We therefore present a novel computer-aided design (CAD) of mixed-signal FPGA. To become a practical CAD approach, this CAD approach can build on top of existing techniques of electronic design automation for FPGA, or other CPD. Obviously, these techniques can also be used for design automation of CMSS.

Figure 27:
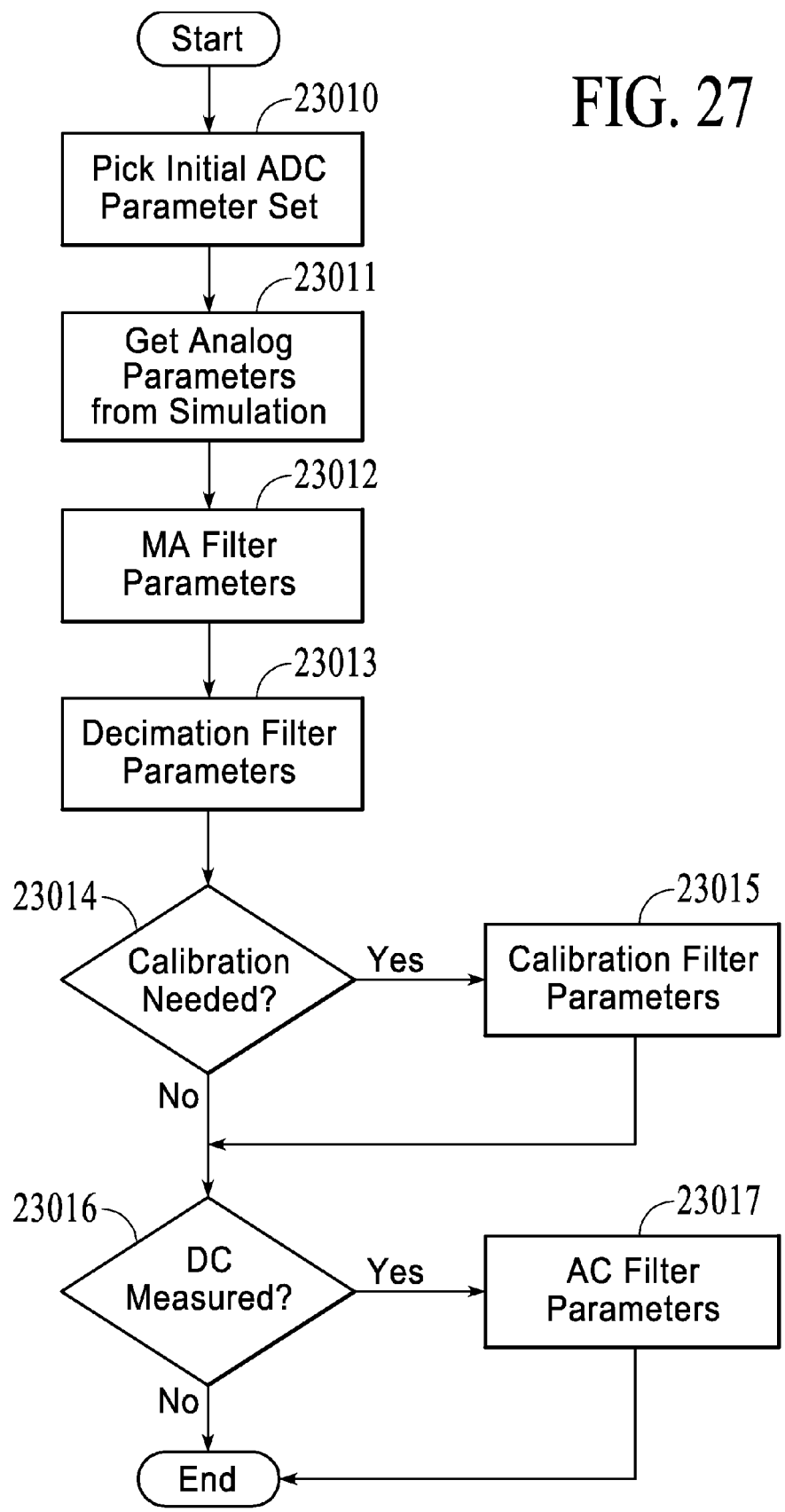
FIG. 27 shows a detailed flow diagram for mixed-signal FPGA input component generation.

FIG. 27 shows the method for generating components for a CMSSI, for example CMSSI of FIG. 20. In a first step 23010 the initial parameter settings for the DSM ADC are determined. This step 23010 can, for example, be step 14001 of FIG. 18. In the next step 23011 the analog parameters are retrieved from simulation. This step 23011 can, for example, be the outcome of the method in FIG. 18 where the best parameter settings can be retrieved as a result from step 14006. The analog to-digital converter which can be, for example, DSM ADC of FIG. 5, or DSM ADC of FIG. 6, or DSM ADC of FIG. 7 is now properly parameterized. In a next step 23012 the parameter settings for the moving-average low-pass filter are determined. This moving-average low-pass filter can, for example be the moving-average low-pass filter 16012 of FIG. 20. The parameter settings of the moving-average low-pass filter can be determined by user interaction, for example via a GUI, or can be computed by a simulation-based optimization routine. In a subsequent step 23013 the parameter settings for the decimation filter are determined. This decimation filter can, for example be the decimation filter 16013 of FIG. 20. The parameter settings of the decimation filter can be determined by user interaction, for example via a GUI, or can be computed by a simulation-based optimization routine. Then the decision 23014 decides whether additional mixed-signal calibration is needed. If this is the case, then in step 23015 the calibration filter parameter settings are determined.

This calibration filter can, for example, be the calibration filter 16014 from FIG. 20. The parameter settings of the calibration filter can be determined by user interaction, for example via a GUI, or can be computed by a simulation-based optimization routine. Then the decision 23016 decides whether additional analog-digital filtering is needed. If this is the case, then in step 23017 the zero-offset filter parameter settings are determined. This zero-offset filter can, for example be the zero-offset filter 16015 of FIG. 20. The parameter settings of the zero-offset filter can be determined by user interaction, for example via a GUI, or can be computed by a simulation-based optimization routine. The outcome of the method in FIG. 27 is the CMSSI component including the DSM ADC and subsequent signal conditioning, filtering and processing optimized for the application.

Figure 28:
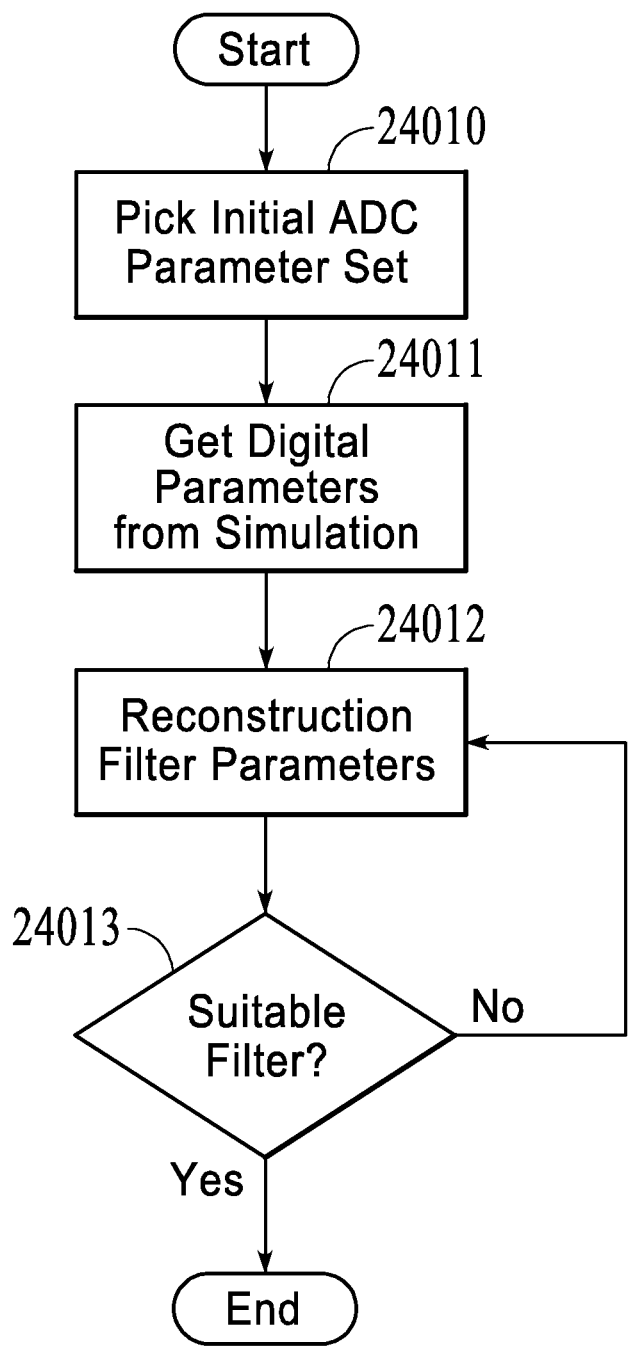
FIG. 28 shows a detailed flow diagram for mixed-signal FPGA output component generation.

FIG. 28 describes the method for generating components for a CMSSO, for example CMSSO of FIG. 21. In a first step 24010 the initial parameter settings for the DSM DAC are determined. This step 24010 can, for example, be step 15001 of FIG. 19. In the next step 24011 the digital parameters are retrieved from simulation. This step 24011 can, for example be the outcome of the method in FIG. 19 where the best parameter settings can be retrieved as a result from step 15006. The DSM DAC which can, for example, be DSM DAC of FIG. 8, or DSM DAC of FIG. 9 is now properly parameterized.

In a next step 24012 the parameter settings for the reconstruction filter are determined. This reconstruction filter can, for example, be the reconstruction filter 17013 of FIG. 21. In a subsequent decision 24013 the reconstruction filter is analyzed for suitability. If the reconstruction filter is determined as not suitable, for example because insufficient signal-to-noise ratio or other electrical signal analysis results, the step 24012 is repeated. If the reconstruction filter is suitable, the algorithm for the CMSSO computation is finished. The outcome of the method in FIG. 28 is a CMSSO component including the DSM DAC and subsequent signal conditioning and filtering, optimized for the application.

CMSS are typically implemented by mounting one, or more, CPD on PCB. PCB manufacturing variations, aging effects or environmental effects may lead to different quality-of-results for one and the same implementation, either over a batch of manufactured and assembled systems, or variations over the lifetime. To counter those adverse effects, FIG. 34 describes a system architecture that can calibrate a CMSS automatically, to work around above mentioned effects, for example.

Inside CPD 30040 is instantiated the analog-to-digital converter 30010 and the digital-to-analog converter 30030. Analog-to-digital converter 30010 can, for example, be the DSM ADC of FIG. 5, or of FIG. 6, or of FIG. 7, or the CMSSI generated by the method described in FIG. 18, or the CMSSO generated by the method described in FIG. 27. Digital-to-analog converter 30030 can, for example, be the DSM DAC of FIG. 8, or of FIG. 9, or the CMSSO generated by the method described in FIG. 19, or the CMSSO generated by the method described in FIG. 28.

The sample values which are the output from analog-to-digital converter 30010 are processed by the Auto-Calibration Module 30020, The result from the auto calibration module 30020 is input into the digital-to-analog converter 30030. The input of analog-to-digital converter 30010 is driven by the output of said digital-to-analog converter 30030 via loopback cable 30050. The auto calibration module 30030 can now generate certain digital signals to be converted into the analog domain by digital-to-analog converter 30030 and converted back into the digital domain by analog-to-digital converter 30010. By looking at the original signal data and by comparing it with the response from digital-to-analog converter and analog-to-digital converter the auto calibration module 30020 can perform optimization and testing of the signal path, for example, the auto calibration module can adjust parameter settings for the analog-to-digital converter 30010, or can adjust parameter settings for the digital-to-analog converter 30030, or both. Adjustments may include delta-sigma modulator parameters, or settings for the filters used in the CMSSI and/or the CMSSO. These optimizations may be user-controlled or may be performed in an automated manner.

It is obvious that this system may not only serve for calibrating the CMSS, but it may also be used for analysis and characterization of the signal paths, including the signal path inside the CPD 30040, outside of CPD 30040, for example on a PCB, or the loopback cable. Thus, in one embodiment, this system serves as a characterization means for analog signal connections such as the loopback cable 30050. In one other embodiment, this system serves as a characterization means for one, or more, CPD, in yet another embodiment, this system serves as a characterization means for the PCB.

Figure 34:
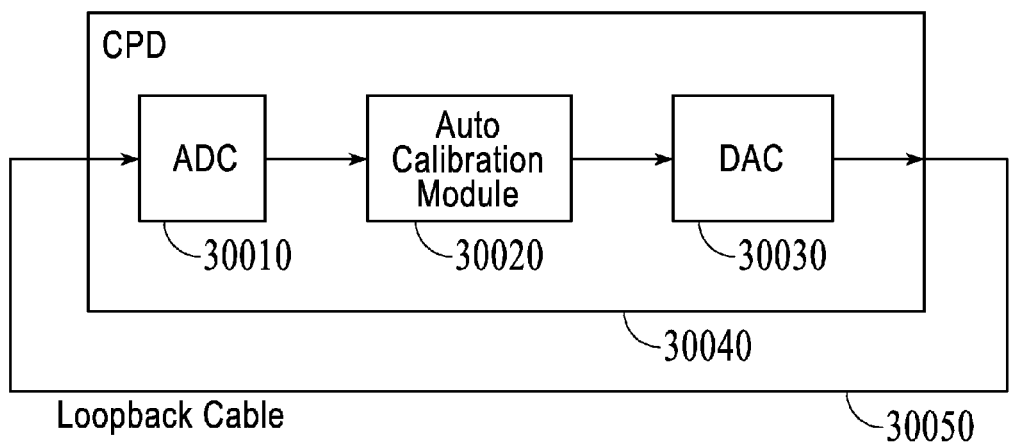
FIG. 34 shows auto-calibration of mixed-signal FPGA input/output system.

It is obvious to those trained in the art that the system of FIG. 34 may also have two, or more, signal paths, each with the same analog-to-digital converter or with two, or more, different Analog-to-Digital Converters. Alternatively, the system of FIG. 34 may also have two, or more, signal paths, each with the same digital-to-analog converter or with two, or more, different analog-to-digital converters. Alternatively, the system of FIG. 34 may also have two, or more, signal paths, each with the same CPD or with two, or more, different CPD.

Figure 35:
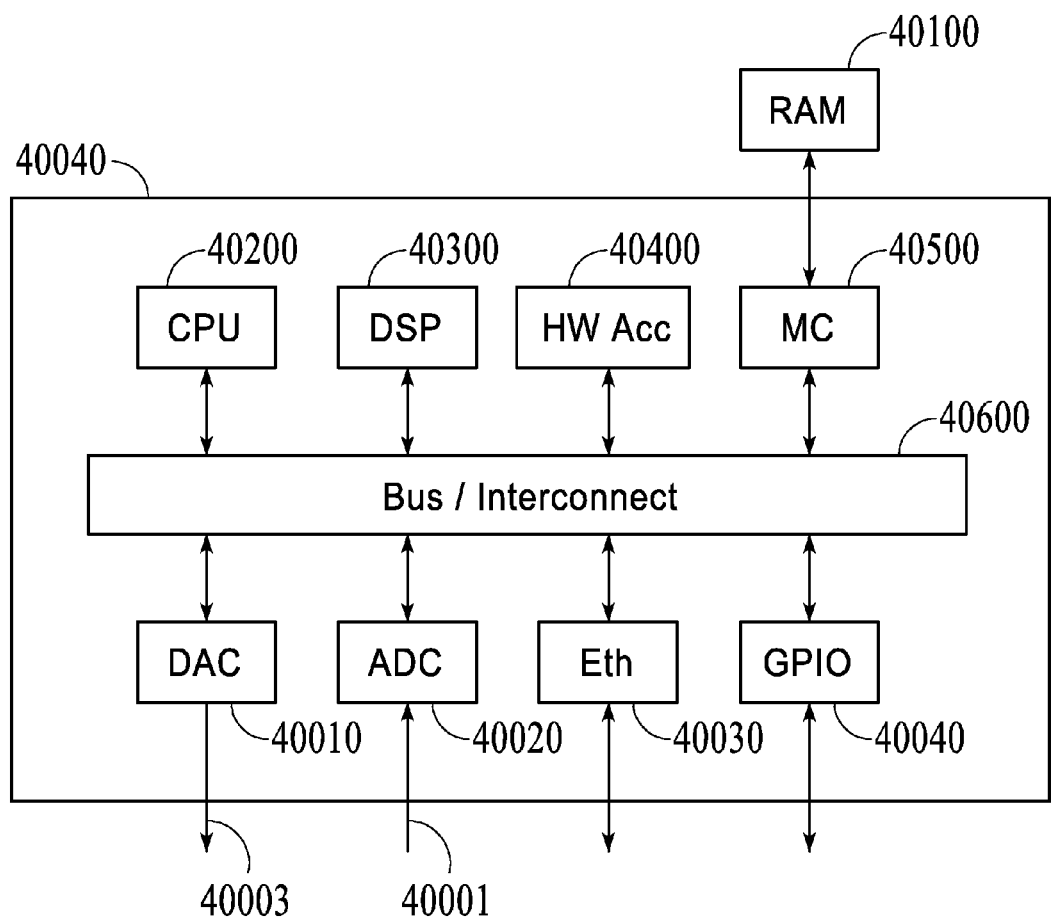
FIG. 35 is a block diagram of a mixed-signal processing platform.

One embodiment is the CMSS of FIG. 35. Such a CMSS can be implemented using CPD 40040 and can have a separate, external memory 40100. When the CMSS is implemented as a so-called system-on-chip, the CMSS can include one, or more, CPU 40200 running computer software programs, with, or without, an operating system, one, or more, DSP 40300, running DSP software programs, one, or more, hardware accelerators 40400, such as, for example, video processing engines, crypto-engines, accelerated signal processing, etc, one, or more, memory 28 controllers 40500, one, or more, digital-to-analog converter 40010, one, or more, analog-to-digital converter 40020, one, or more, connectivity controllers 40030, such as, for example, Ethernet, USB, CAN, LIN, Flexray, EtherCat, SPI, IIC, GPIO, SATA, SAS, NVMe, etc.

These components can be connected with each other via one, or more, system buses, or via on-chip interconnect such as, for example, PLB, AXI, etc. The digital-to-analog converter components 40010 can, for example, be the CMSSO components as described in FIG. 21, or the CMSSO components generated by the method described in FIG. 28. The analog-to-digital converter components 40020 can, for example, be the CMSSI components of FIG. 20, or the CMSSO components generated by the method described in FIG. 27. It is obvious that using multichip partitioning, for example, the CMSS system of FIG. 35 can be implemented in one single CPD or the CMSS of FIG. 35 can be implemented in two, or more, CPD. It is also obvious that this system manifests itself either as a PCB with one, or more, CPD integrated on said PCB, and where the one, or more, CPD are configured to perform the functioning of the CMSS. Alternatively, the system manifests itself as CMSS configuration data which makes the one, or more, CPD perform said CMSS functioning.

Figure 36:
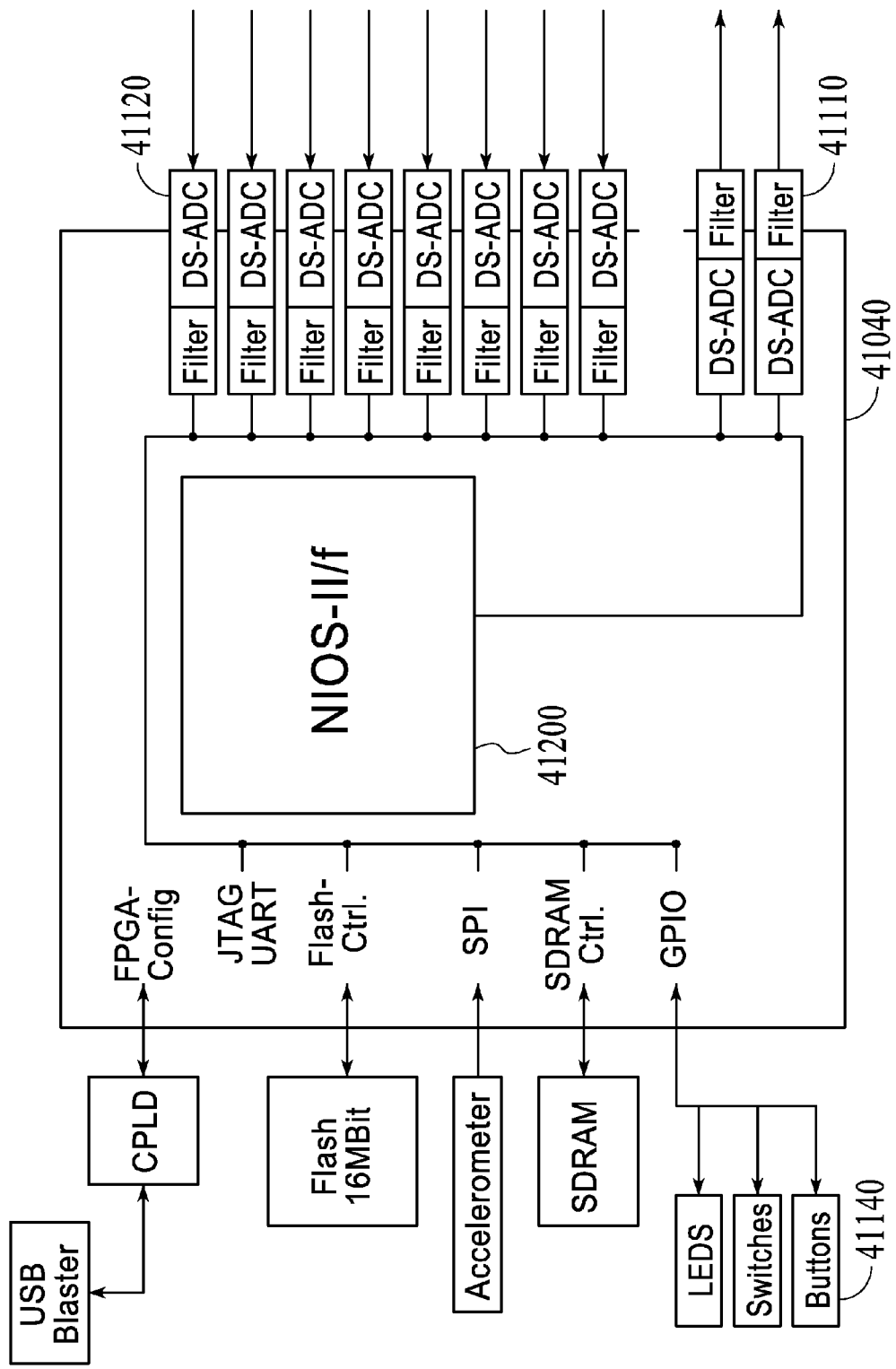
FIG. 36 is a block-diagram of an exemplary configurable mixed-signal systems (CMSS) architecture.

As shown in FIG. 36, embedded inside CPD 41040 is the microprocessor 41200. This microprocessor 41200 has one, or more, peripherals implemented either also embedded inside CPD 41040, or external to CPD 41040. Such peripherals can include external RAM 41100, or general-purpose input/output (GPIO) 41140. Also connected to the microprocessor 41200 is one, or more, DSM DAC 41110 and one, or more, DSM ADC 41120, both of which are embedded inside the CPD 41040. This effectively turns the digital embedded CPD-based microprocessor system into a CMSS. With almost all key components being configurable, i.e. implemented in programmable/configurable logic, such a CMSS can be altered, changed, fixed, augmented, extended during the development and the deployment cycle without major changes to the underlying hardware (the PCB, for example). This has many benefits, including the ability and flexibility to respond to changes in the specification, adoption of evolving protocols, and/or to counter parts obsolescence.

Figure 37:
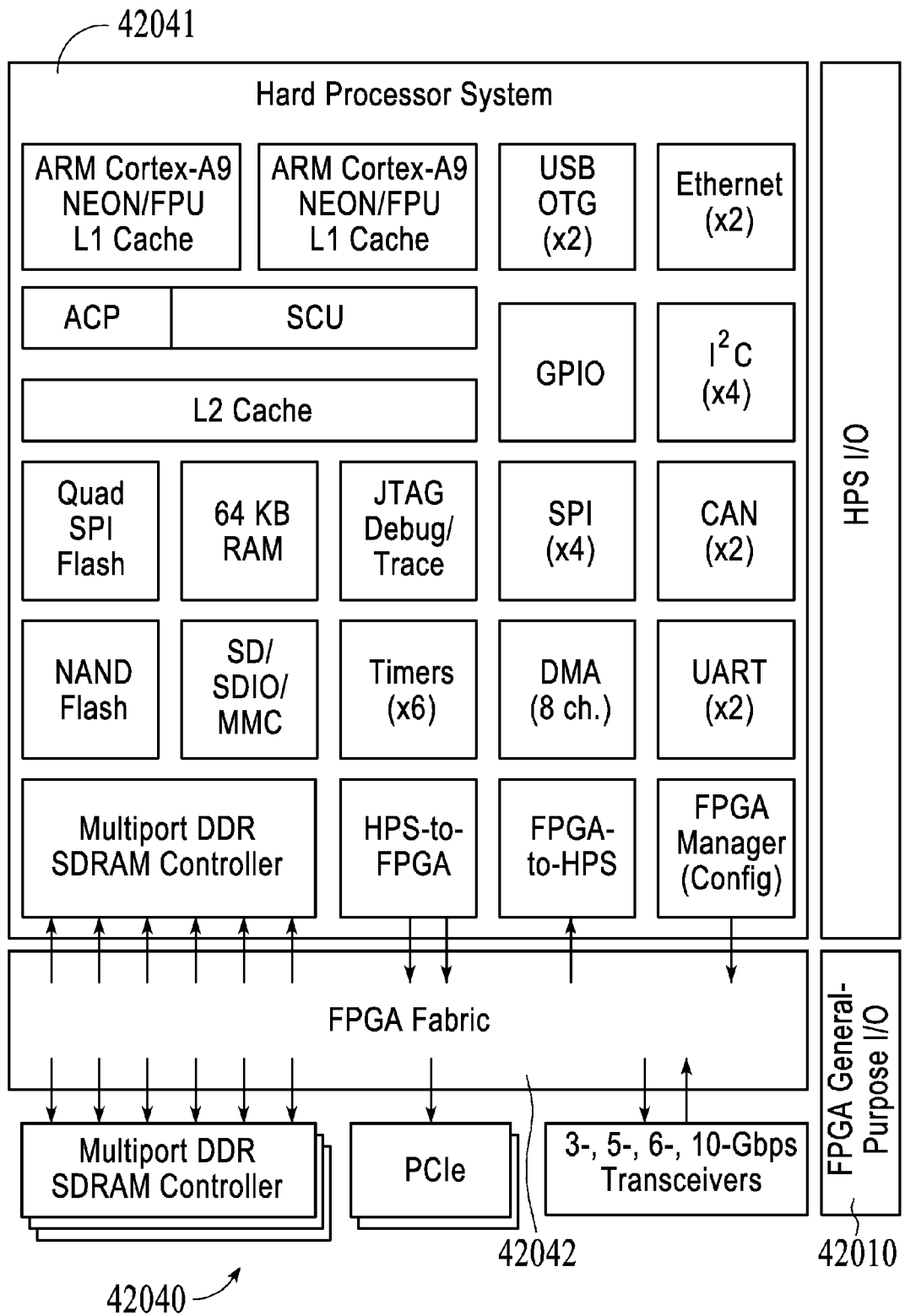
FIG. 37 is a block-diagram of an exemplary CMSS architecture.

In yet another embodiment is the system of FIG. 37 where embedded inside CPD 42040 is a so-called Hard Processor System 42041 which, for example, can include a Dual-Core ARM Cortex-A9 microprocessor core from ARM Ltd., and can also include one, or more, peripheral blocks for USB, Ethernet, UART, SPI, for example. Said Hard Processor System 42041 is implemented as a so-called hard block. Hard semiconductor IP blocks are not as configurable as the same functionality implemented in programmable logic but, typically, are more compact and as such can be more cost-efficiently be manufactured. Said Hard Processor System 42041 can be combined with FPGA Fabric 42042 and FPGA General Purpose I/O 42010 to implement the configurable portions of a system. For example, FPGA Fabric 42042 together with FPGA General Purpose I/O 42010, despite being digital circuitry, can be used to implement CMSSI and/or CMSSO based on the techniques described herein.

Figure 38:
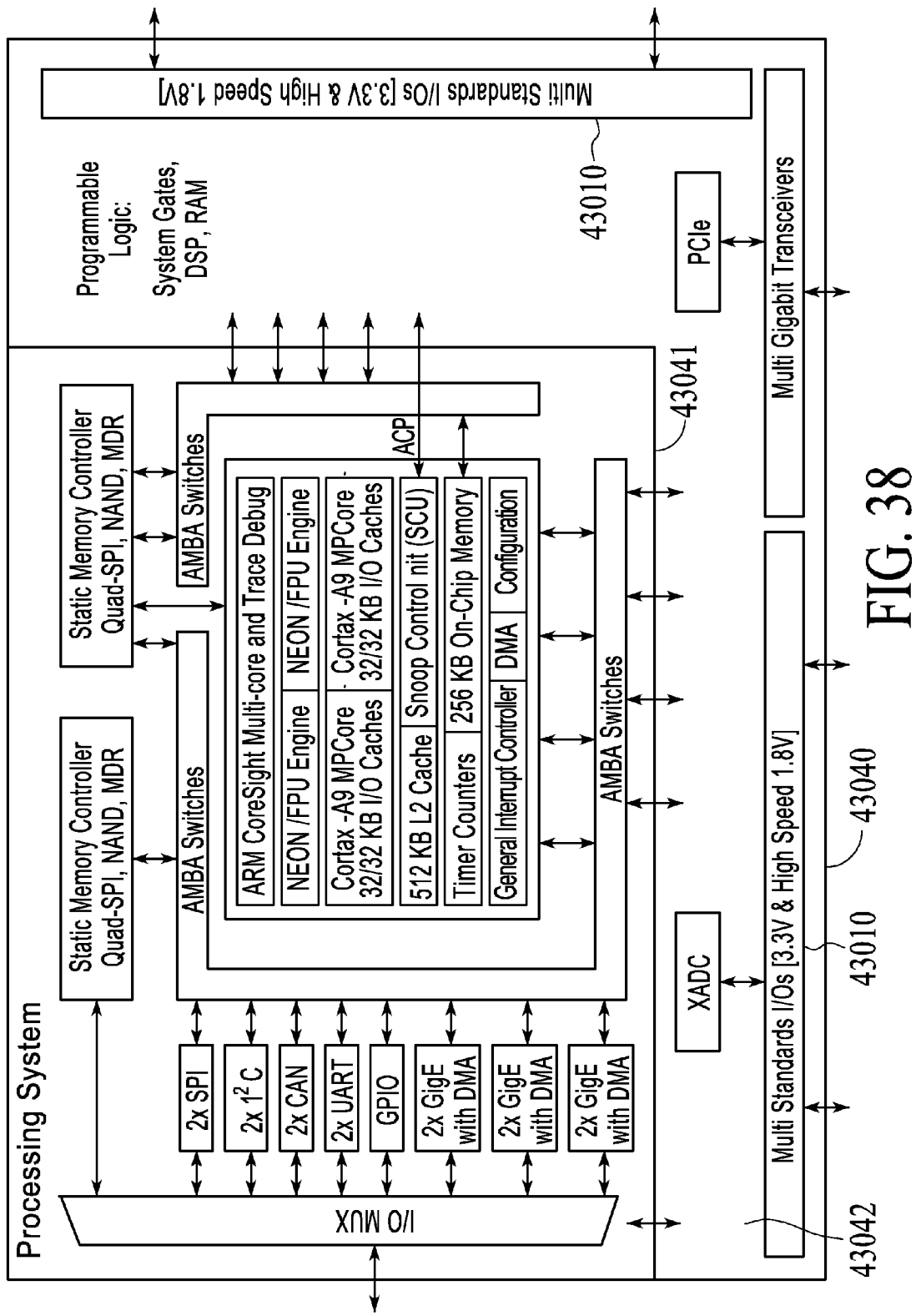
FIG. 38 is a block-diagram of an exemplary CMSS architecture.

In yet another embodiment, is shown the system of FIG. 38 where embedded inside CPD 43040 is a so-called Processing System 43041 which, for example, can include a Dual-Core ARM Cortex-A9 microprocessor core from ARM Ltd., and can also include one, or more, peripheral blocks for USB, Ethernet, UART, SPI, for example. Said Processing System 43041 is implemented as a so-called hard block. Said Processing System 43041 can be combined with Programmable Logic 43042 and Multi Standards I/O 43010 to implement the configurable portions of a system. Furthermore, Programmable Logic 43042 together with Multi Standards I/O 43010, despite being digital circuitry, can be used to implement CMSSI and/or CMSSO based on the techniques described herein.

Following Moore's Law closely, CPD enjoy a significant increase in programmable logic resources. One effect is that CPD today can be used to implement entire systems within a single programmable device, such as a PSOC. Combined with the techniques described herein, CPD can now be used to migrate digital and analog functionality into one single CPD. One outcome of this is that significant portions of the functionality that used to be spread over many components mounted on a PCB now are inside one single device, which is configurable, an aspect which can be called programmable PCB, or "soft" PCB. When looking at analog-to-digital converter functionality which typically is implemented by mounting dedicated analog-to-digital converter devices on a PCB, the techniques described herein can be seen as a programmable analog-to-digital converter, or "soft" analog-to-digital converter. Similarly, when looking at digital-to-analog converter functionality which typically is implemented by mounting dedicated digital-to-analog converter devices on a PCB, the techniques described herein can be seen as a programmable digital-to-analog converter, or "soft" digital-to-analog converter. Alternatively, when looking at implementations of so-called ASSP which typically are implemented by mounting dedicated ASSP devices on a PCB, the techniques described herein can be seen as a programmable ASSP, or "soft" ASSP.

Figure 39:
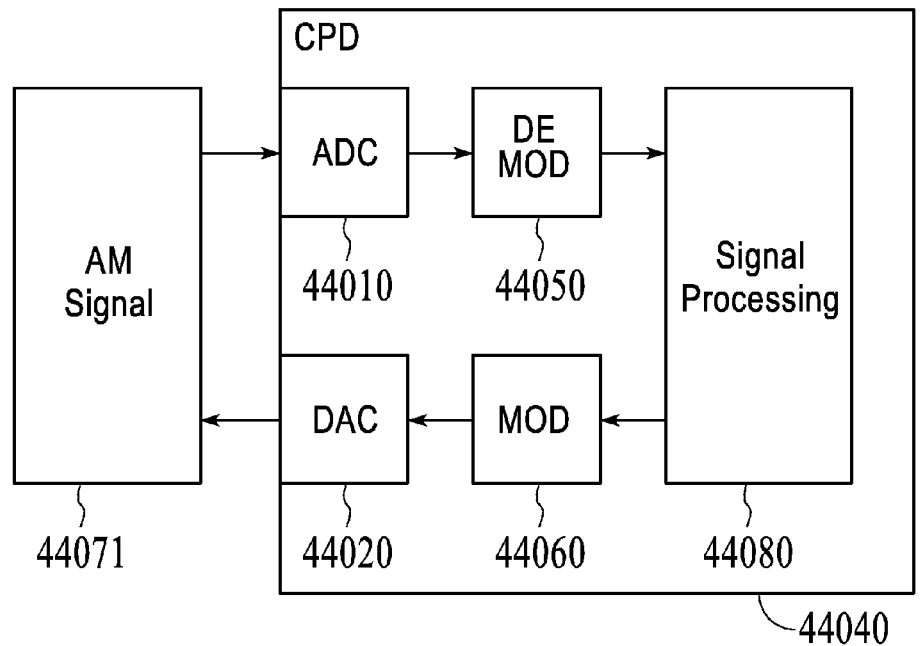
FIG. 39 shows architecture of a configurable analog modem.

According to another embodiment, FIG. 39 describes a CMSS implemented inside CPD 44040 which utilizes the DSM ADC and the DSM DAC described herein to interface with Amplitude-Modulated (AM) signals. The element 44070 is the AM Signal which, for example, can be an ISDN signal, or any other amplitude-modulated signal. The element 44010 is an analog-to-digital converter which, for example, can be the DSM ADC from FIG. 5, FIG. 6, or FIG. 7, or generated by the methods from FIG. 18 or FIG. 27. The element 44020 is a digital-to-analog converter which, for example, can be the DSM DAC from FIG. 8, or FIG. 9, or generated by the methods from FIG. 19 or FIG. 28. The element 44050 is a Demodulator for the information, data, or signals generated by the DSM ADC from element 44010. This can, for example, be done using an NCO and multipliers. The element 44080 performs the Signal Processing which can, for example, be the DSP 1041, or the CPU 1042, or the Programmable Logic 1043 from FIG. 1. The element 44060 is a Modulator for the data generated by element 44080 and which can be implemented, for example, by an NCO and multipliers.

Figure 40:
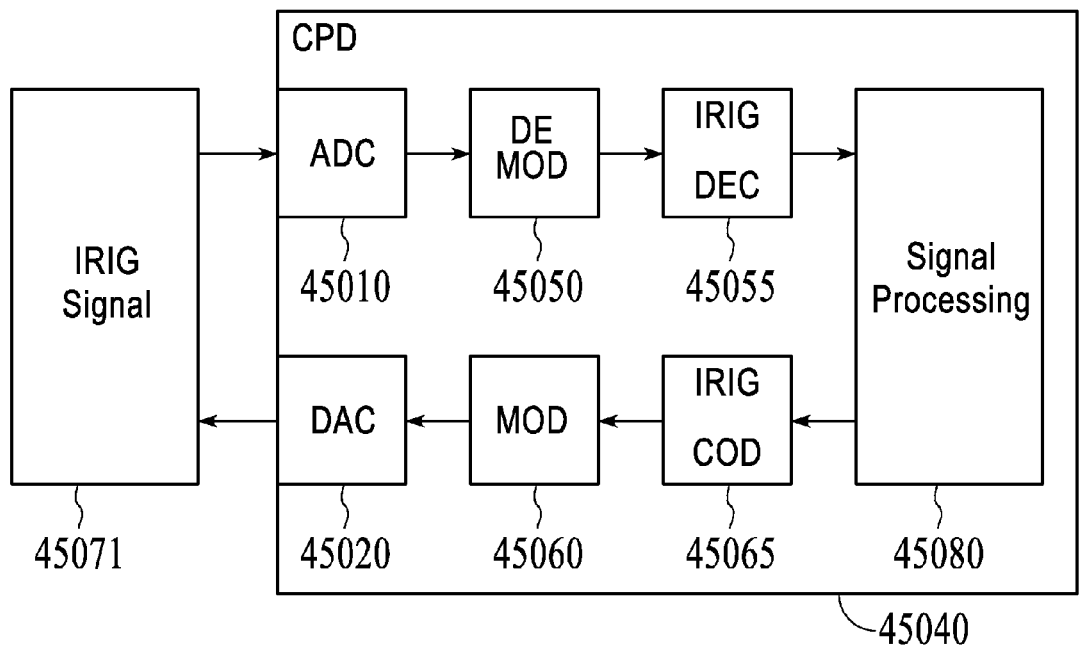
FIG. 40 shows a configurable IRIG modem.

According to yet another embodiment, FIG. 40 describes a CMSS implemented inside CPD 45040 which utilizes the DSM ADC and the DSM DAC described herein to interface with IRIG signals. The element 45010 is an ADC which, for example, can be the DSM ADC from FIG. 5, FIG. 6, or FIG. 7, or generated by the methods from FIG. 18 or FIG. 27. The element 45020 is a DAC which, for example, can be the DSM DAC from FIG. 8, or FIG. 9, or generated by the methods from FIG. 19 or FIG. 28. The element 45050 is a demodulator for the data generated by the DSM ADC from element 45010. This can, for example, be done using an NCO and multipliers. The element 45055 is the decoder for the IRIG data. The element 45080 performs the signal processing which can, for example, be the DSP 1041, or the CPU 1042, or the programmable logic 1043 from FIG. 1. The element 45065 is the coder which generates the IRIG Frame from the data received by element 45080. The element 45060 is a Modulator for the data generated by element 45065. It can be implemented, for example, by an NCO and multipliers.

Figure 41:
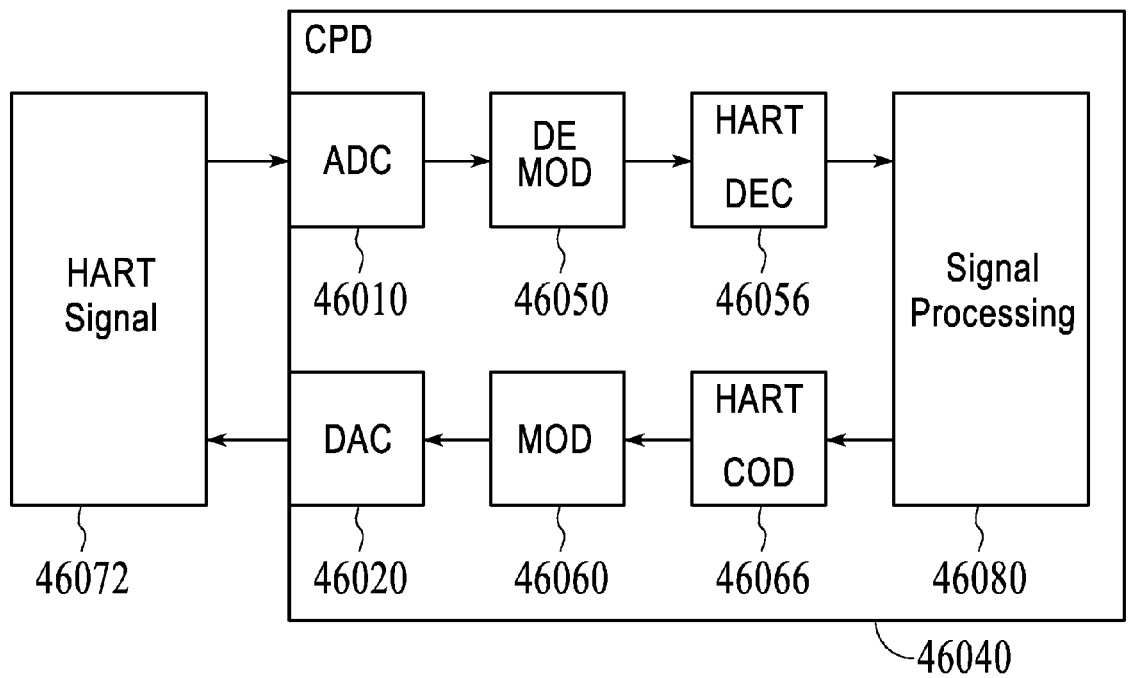
FIG. 41 shows a configurable HART Modem.

According to yet another embodiment, FIG. 41 describes a CMSS implemented inside CPD 46040 which utilizes the DSM ADC and the DSM DAC described herein to interface with HART signals. The element 46072 is the HART signal complying the HART standard. The element 46010 is an ADC which, for example, can be the DSM ADC from FIG. 5, FIG. 6, or FIG. 7, or generated by the methods from FIG. 18 or FIG. 27. The element 46020 is a DAC which, for example, can be the DSM DAC from FIG. 8, or FIG. 9, or generated by the methods from FIG. 19 or FIG. 28. The element 46050 is a Demodulator for the data generated by the DSM ADC from element 45010. This can, for example, be done using an NCO and multipliers. The element 46056 is the decoder for the HART data. The element 46080 performs the Signal Processing which can, for example, be the DSP 1041, or the CPU 1042, or the Programmable Logic 1043 from FIG. 1.

The element 46066 is the Coder which generates the HART Frame from the data received by element 46080. The element 46060 is a Modulator for the data generated by element 46066. It can be implemented, for example, by an NCO and multipliers.

Figure 42:
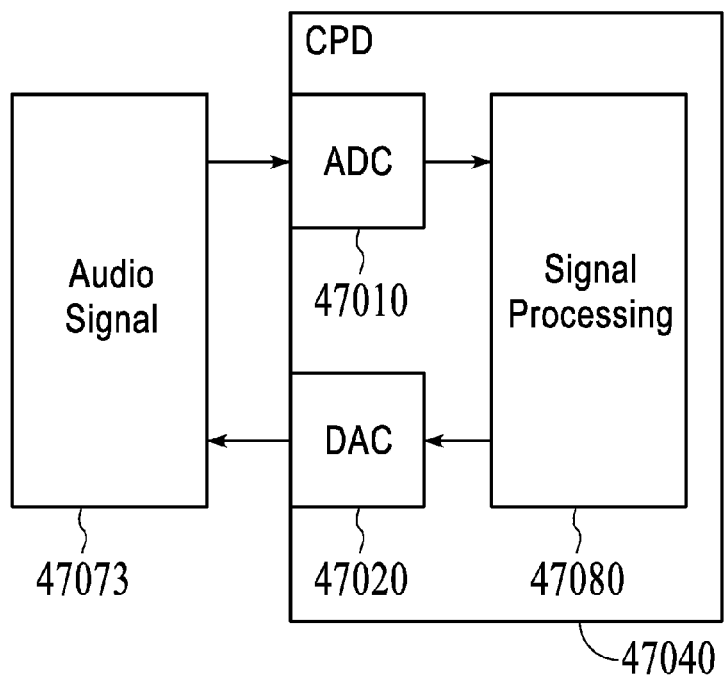
FIG. 42 shows audio processing With a CMSS.

According to yet another embodiment, FIG. 42 describes a CMSS implemented inside CPD 47040 which utilizes the DSM ADC and the DSM DAC described herein for general audio processing systems. The element 47073 is a audio system which can deliver or receive audio data or both, deliver and receive. It can for example be a microphone, a CD recorder or a line out socket in a PC. The element 47010 is an ADC which, for example, can be the DSM ADC from FIG. 5, FIG. 6, or FIG. 7, or generated by the methods from FIG. 18 or FIG. 27. The element 47020 is a DAC which, for example, can be the DSM DAC from FIG. 8, or FIG. 9, or generated by the methods from FIG. 19 or FIG. 28. The element 47080 performs the Signal Processing which can, for example, be the DSP 1041, or the CPU 1042, or the Programmable Logic 1043 from FIG. 1.

Figure 43:
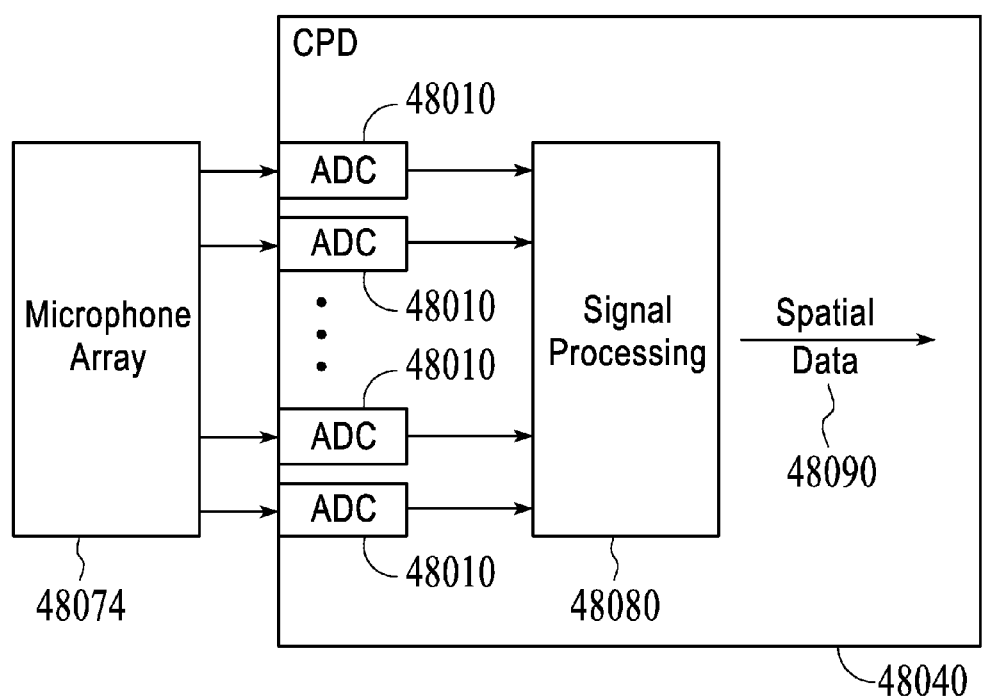
FIG. 43 shows an acoustic camera system using CMSS.

According to yet another embodiment, FIG. 43 describes a CMSS implemented inside CPD 48040 which utilizes the DSM ADC and the DSM DAC described herein for spatial audio processing. The element 48074 is a microphone array with two or more microphones arranged in a line or a 2 dimensional pattern. The element 48010 is an ADC which, for example, can be the DSM ADC from FIG. 5, FIG. 6, or FIG. 7, or generated by the methods from FIG. 18 or FIG. 27. The element 48080 is the Signal The element 47080 performs the Signal Processing which can, for example, be the DSP 1041, or the CPU 1042, or the Programmable Logic 1043 from FIG. 1. It calculates from the data of the element 48010 the spatial data seen in element 48090.

Figure 44:
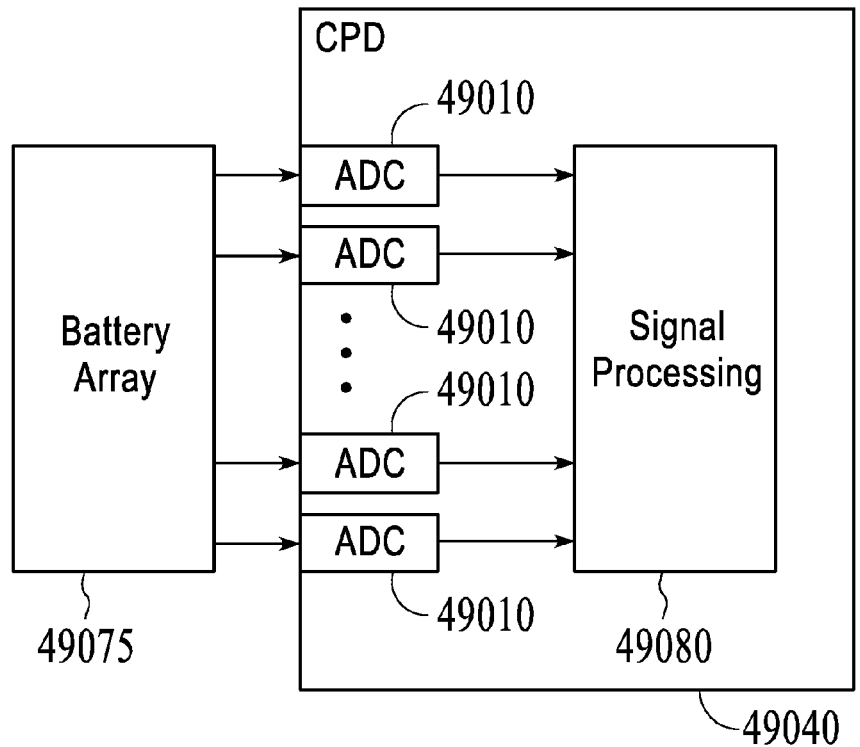
FIG. 44 shows an electric vehicle battery management system with CMSS.

According to yet another embodiment, FIG. 44 describes a CMSS implemented inside CPD 49040 which utilizes the DSM ADC and the DSM DAC described herein document for measuring the parameters of a battery consisting of one or more battery modules. This can, for example, be used in an electrical vehicle. The element 49075 is the battery array which can consist of one or more batteries. The element 49010 is an ADC which, for example, can be the DSM ADC from FIG. 5, FIG. 6, or FIG. 7, or generated by the methods from FIG. 18 or FIG. 27. The element 48080 performs the Signal Processing which can, for example, be the DSP 1041, or the CPU 1042, or the Programmable Logic 1043 from FIG. 1. It calculates from the data of the element 49010 the electrical parameters of the battery array.

Figure 45:
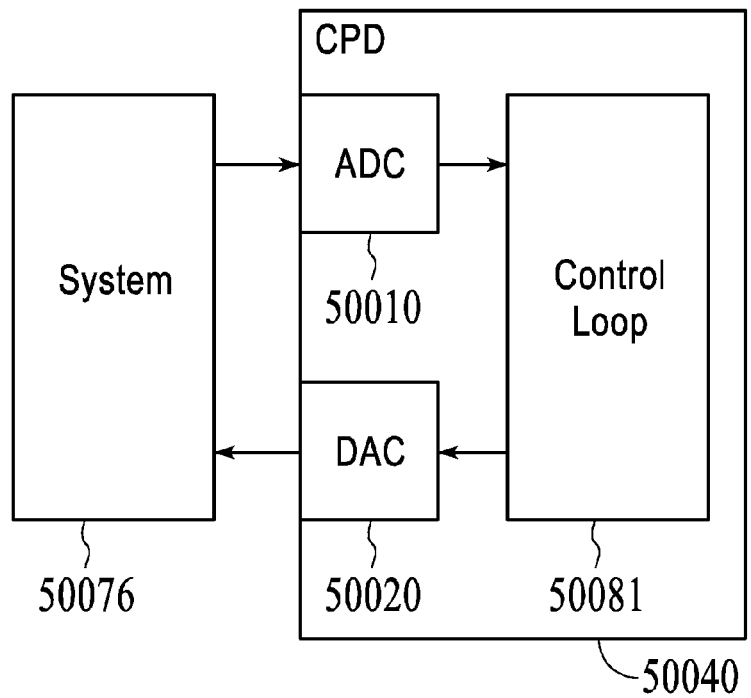
FIG. 45 shows real-time control system implementation using CMSS.

According to yet another embodiment, FIG. 45 describes a CMSS implemented inside CPD 50040 which utilizes the DSM ADC and the DSM DAC described herein to build a control loop. The element 50076 is an example system which is to be controlled.

The element 50010 is an ADC which, for example, can be the DSM ADC from FIG. 5, FIG. 6, or FIG. 7, or generated by the methods from FIG. 18 or FIG. 27. The element 50020 is a DAC which, for example, can be the DSM DAC from FIG. 8, or FIG. 9, or generated by the methods from FIG. 19 or FIG. 28.

The element 50081 is the control loop of the controller which can, for example, be the DSP 1041, or the CPU 1042, or the Programmable Logic 1043 from FIG. 1.

Figure 46:
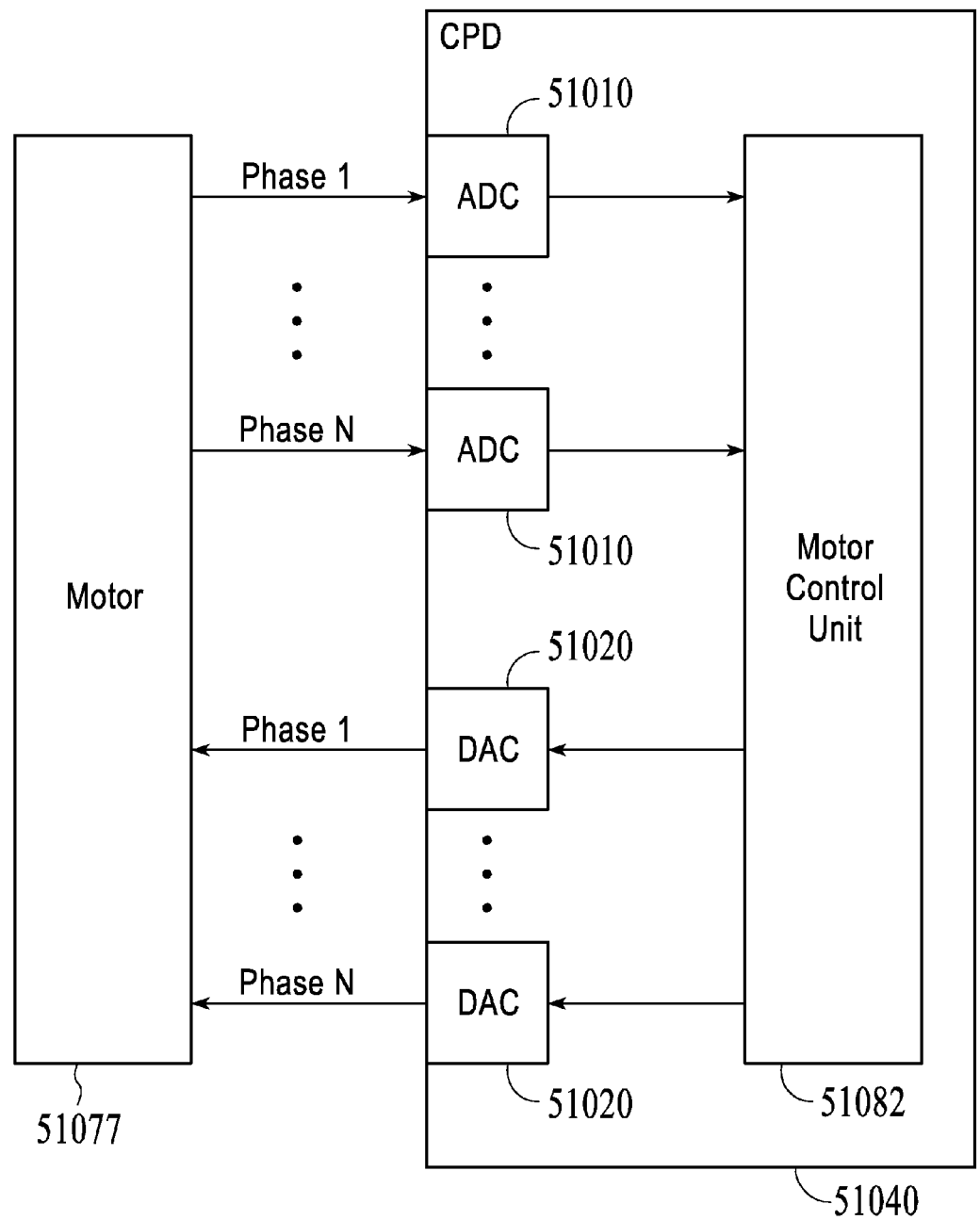
FIG. 46 shows a smart motor control system with CMSS.

According to yet another embodiment, FIG. 46 describes a CMSS implemented inside CPD 51040 which utilizes the DSM ADC and the DSM DAC described herein to build a motor controller. The element 51010 is an ADC which, for example, can be the DSM ADC from FIG. 5, FIG. 6, or FIG. 7, or generated by the methods from FIG. 18 or FIG. 27. The element 51020 is a DAC which, for example, can be the DSM DAC from FIG. 8, or FIG. 9, or generated by the methods from FIG. 19 or FIG. 28. The element 51082 is the motor control unit which can, for example, be the DSP 1041, or the CPU 1042, or the Programmable Logic 1043 from FIG. 1.

Figure 47:
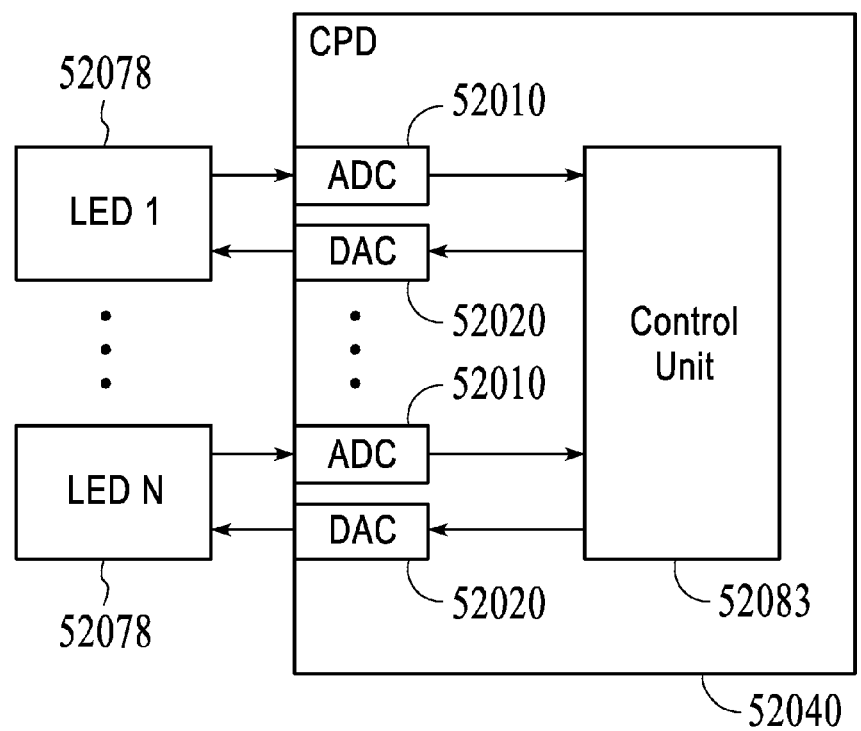
FIG. 47 shows an LED lighting installation with CMSS.

According to yet another embodiment, FIG. 47 describes a CMSS implemented inside CPD 52040 which utilizes the DSM ADC and the DSM DAC described herein to build a lightning system using LEDs. The element 52078 is a LED module. Each system can have one or more LED modules. The element 52010 is an ADC which, for example, can be the DSM ADC from FIG. 5, FIG. 6, or FIG. 7, or generated by the methods from FIG. 18 or FIG. 27. The element 52020 is a DAC which, for example, can be the DSM DAC from FIG. 8, or FIG. 9, or generated by the methods from FIG. 19 or FIG. 28. The element 52083 is the Control Unit which can, for example, be the DSP 1041, or the CPU 1042, or the Programmable Logic 1043 from FIG. 1. It can control each LED module and have input parameters such as the ambient light or the temperature of the LED modules.

Figure 48:
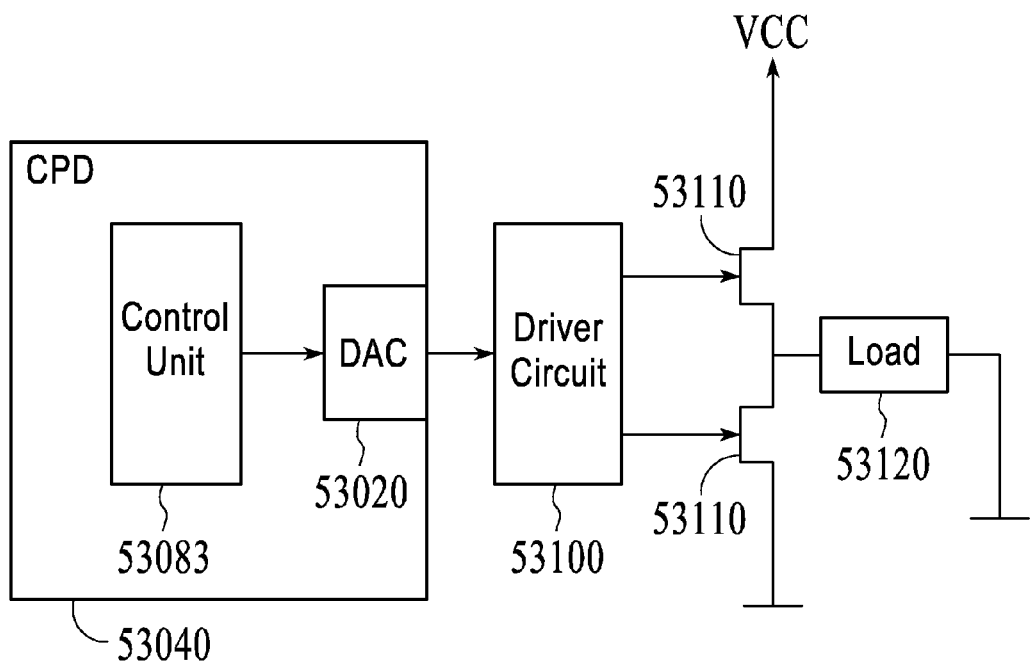
FIG. 48 shows a Class-S amplifier implementation using CMSS.

And, according to yet another embodiment, FIG. 48 describes a CMSS implemented inside CPD 52040 which utilizes the DSM ADC and the DSM DAC described herein to build a class s amplifier which can, for example, be an audio amplifier, or a LED application. The element 53083 is the control unit which generates the data for the DSM DAC. This can be audio data, or motor control data, or the control commands to a valve. The element 53020 is a DAC which, for example, can be the DSM DAC from FIG. 8, or FIG. 9, or generated by the methods from FIG. 19 or FIG. 28. The element 53100 is the driver circuit which generates the voltages needed driving the power electronics shown on element 53110. The element 53120 is the load which can for example be a speaker, or an LED, or an Motor.

It is obvious that many other amplitude-modulated protocols which have some analog input behavior and/or analog output behavior can be implemented in CMSS using today's CPD, and/or FPGA devices. Thereby, our embodiments disclosed herein enable the efficient and cost-effective realization of electronic systems for sensor fusion, for example, allows enhanced component integration for reducing the footprint which is required when inserting an electronic system in confined spaces. Furthermore, embodiments disclosed herein allow reduction of the Bill-of-Materials by integrating many analog components into one, or more, CPDs. It also helps reducing the number of variants because with our invention one and the same PCB can be configured to suit different applications.

We claim:

1. An electronic system comprising:
   an analog-to-digital converter that converts an analog signal to a digital signal, the analog-to-digital converter including:
   a first input that receives the analog signal,
   a second input that receives a reference signal,
   a network of passive components including at least one resistor and one capacitor, the network of passive components being connected to the first input, and
   a configurable processing device, including:
   a low voltage differential signaling (LVDS) comparator having a first comparator input connected to the reference signal, having a second comparator input connected to the network of passive components and having a comparator output, and
   a flip-flop (FF) having a FF input connected to the comparator output and having an FF output that produces the digital signal, the FF output being connected and providing feedback to the network of passive components.

2. An electronic system as in claim 1:
   wherein parameters for the analog-to-digital converter are selected based on a simulation of performance of the analog-to-digital converter within the configurable processing device.

3. An electronic system as in claim 1, additionally comprising:
   a filter that filters the digital signal.

4. An electronic system as in claim 3 wherein the filter is one of:
   a moving average filter
   a decimation filter;
   a calibration module;
   a zero offset filter.

5. An electronic system as in claim 1 wherein the configurable processing device is a programmable logic device.

6. An electronic system as in claim 1 wherein the configurable processing device is a field programmable gate array.

7. An electronic system as in claim 1 wherein the configurable processing device is configured to operate as an analog modem.

8. An electronic system as in claim 1 wherein the configurable processing device is configured to operate as an inter-range instrumentation group modem.

9. An electronic system as in claim 1 wherein the configurable processing device is configured to operate as a highway addressable remote transducer modem.

10. An electronic system as in claim 1, wherein the network of passive components comprises:
    a first resistor having a first end connected to the first input, and having a second end connected to the second comparator input;
    a second resistor having a first end connected to the second end of the first resistor, and having a second end connected to the FF output; and
    a first capacitor having a first end connected to the second end of the first resistor, and having a second end connected to a reference voltage.

11. An electronic system as in claim 1, wherein the network of passive components comprises:
    a first resistor having a first end connected to the first input, and having a second end;
    a second resistor having a first end connected to the second end of the first resistor, and having a second end connected to the FF output;

a first capacitor having a first end connected to the second end of the first resistor, and having a second end connected to a reference voltage;

a third resistor having a first end connected to the second comparator input, and having a second end connected to connected to the first input, and having a second end to the FF output;

a fourth resistor having a first end connected to the second end of the first resistor, and having a second end connected to the first end of the third resistor; and a capacitor having a first end connected to the second end of the fourth resistor, and having a second end connected to the reference voltage.

12. An electronic system as in claim 1, wherein the network of passive components comprises:

a first resistor having a first end connected to the first input, and having a second end;

a second resistor having a first end connected to the second end of the first resistor, and having a second end connected to the FF output;

a capacitor having a first end connected to the second end of the first resistor, and having a second end connected to the second comparator input; and, a second comparator having a first comparator input connected to the second end of the first resistor, having a second input connected to a reference voltage, and having an output connected to the second end of the capacitor.

13. An electronic system comprising:

an analog-to-digital converter that converts an analog signal to a digital signal, the analog-to-digital converter including:

a first input that receives the analog signal, a second input that receives a reference voltage, a network of passive components including at least one resistor and one capacitor, the network of passive components being connected to the first input, and a configurable processing device, including a low voltage differential signaling (LVDS) comparator having a first comparator input connected to the reference voltage, having a second comparator input connected to the network of passive components and having a comparator output, and a flip-flop (FF) having a FF input connected to the comparator output and having an FF output that produces the digital signal, the FF output being connected and providing feedback to the network of passive components.

14. An electronic system as in claim 13:

wherein parameters for the analog-to-digital converter are selected based on a simulation of performance of the analog-to-digital converter within the configurable processing device.

15. An electronic system as in claim 13, additionally comprising:

a filter that filters the digital signal.

16. An electronic system as in claim 15 wherein the filter is one of:

a moving average filter a decimation filter;

a calibration module;

a zero offset filter.

17. An electronic system as in claim 13 wherein the configurable processing device is a programmable logic device or a field programmable gate array.

18. An electronic system as in claim 13 wherein the configurable processing device is configured to operate as an analog modem.

19. An electronic system as in claim 13 wherein the configurable processing device is configured to operate as an inter-range instrumentation group modem or as a highway addressable remote transducer modem.

20. An electronic system comprising:

a delta-sigma modulator analog-to-digital converter that converts an analog signal to a digital signal, the analog-to-digital converter including:

a first input that receives the analog signal, a second input that receives a reference signal, a network of passive components including at least one resistor and one capacitor, the network of passive components being connected to the first input, and a configurable processing device, including:

a low voltage differential signaling (LVDS) comparator having a first comparator input connected to the reference signal, having a second comparator input connected to the network of passive components and having a comparator output, and a flip-flop (FF) having a FF input connected to the comparator output and having an FF output that produces the digital signal, the FF output being connected and providing feedback to the network of passive components.

* * * * *